US012653028B2

(12) United States Patent
Hsiao et al.

(10) Patent No.: US 12,653,028 B2
(45) Date of Patent: Jun. 9, 2026

(54) PACKAGED SEMICONDUCTOR DEVICE INCLUDING LIQUID-COOLED LID AND METHODS OF FORMING THE SAME

(71) Applicant: Taiwan Semiconductor Manufacturing Co., Ltd., Hsinchu (TW)

(72) Inventors: Sheng-Tsung Hsiao, Taoyuan City (TW); Jen Yu Wang, Hsinchu (TW); Chung-Jung Wu, Hsinchu (TW); Tung-Liang Shao, Hsinchu (TW); Chih-Hang Tung, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/605,947

(22) Filed: Mar. 15, 2024

(65) Prior Publication Data

US 2024/0249999 A1     Jul. 25, 2024

Related U.S. Application Data

(63) Continuation of application No. 17/841,007, filed on Jun. 15, 2022, now Pat. No. 11,996,351, which is a
(Continued)

(51) Int. Cl.
*H10W 40/47* (2026.01)
*H10P 54/00* (2026.01)
(Continued)

(52) U.S. Cl.
CPC ............. *H10W 40/47* (2026.01); *H10P 54/00* (2026.01); *H10W 40/037* (2026.01);
(Continued)

(58) Field of Classification Search
CPC . H01L 21/563; H01L 21/565; H01L 23/3121; H01L 23/3135
See application file for complete search history.

(56) References Cited

U.S. PATENT DOCUMENTS

| | | | |
|---|---|---|---|
| 5,403,783 A | 4/1995 | Nakanishi et al. | |
| 5,520,244 A | 5/1996 | Mundinger et al. | |

(Continued)

FOREIGN PATENT DOCUMENTS

| | | |
|---|---|---|
| DE | 102017120875 A1 | 12/2018 |
| JP | 2008124430 A | 5/2008 |
| | 20080224303 | |

OTHER PUBLICATIONS

Han Y. et al., "Si-Based Hybrid Microcooler with Multiple Drainage Microtrenches for High Heat Flux Cooling," IEEE Transactions on Components, Packaging and Manufacturing Technology, vol. 7, Issue 1, Jan. 2017, 8 pages.
(Continued)

*Primary Examiner* — Evan G Clinton
(74) *Attorney, Agent, or Firm* — Slater Matsil, LLP

(57) ABSTRACT

Semiconductor devices including lids having liquid-cooled channels and methods of forming the same are disclosed. In an embodiment, a semiconductor device includes a first integrated circuit die; a lid coupled to the first integrated circuit die, the lid including a plurality of channels in a surface of the lid opposite the first integrated circuit die; a cooling cover coupled to the lid opposite the first integrated circuit die; and a heat transfer unit coupled to the cooling cover through a pipe fitting, the heat transfer unit being configured to supply a liquid coolant to the plurality of channels through the cooling cover.

20 Claims, 37 Drawing Sheets

Related U.S. Application Data continuation of application No. 17/114,886, filed on Dec. 8, 2020, now Pat. No. 11,410,910.

(60) Provisional application No. 63/058,633, filed on Jul. 30, 2020.

(51) Int. Cl.

| | |
|---|---|
| *H10W 40/00* | (2026.01) |
| *H10W 42/00* | (2026.01) |
| *H10W 70/05* | (2026.01) |
| *H10W 70/63* | (2026.01) |
| *H10W 74/01* | (2026.01) |
| *H10W 74/10* | (2026.01) |
| *H10W 74/15* | (2026.01) |
| *H10W 90/00* | (2026.01) |

(52) U.S. Cl.

CPC ......... *H10W 42/00* (2026.01); *H10W 70/093* (2026.01); *H10W 70/095* (2026.01); *H10W 70/635* (2026.01); *H10W 74/012* (2026.01); *H10W 74/016* (2026.01); *H10W 74/114* (2026.01); *H10W 74/121* (2026.01); *H10W 74/15* (2026.01); *H10W 74/142* (2026.01); *H10W 90/724* (2026.01)

(56) References Cited

U.S. PATENT DOCUMENTS

| | | | |
|---|---|---|---|
| 9,224,673 | B2 | 12/2015 | Chen et al. |
| 2004/0099946 | A1 | 5/2004 | Dickey et al. |
| 2005/0212121 | A1 | 9/2005 | Ravi et al. |
| 2008/0150162 | A1 | 6/2008 | Koizumi |
| 2008/0224303 | A1 | 9/2008 | Funakoshi et al. |
| 2009/0316360 | A1 | 12/2009 | Campbell et al. |
| 2013/0062750 | A1 | 3/2013 | Lenniger et al. |
| 2013/0270690 | A1 | 10/2013 | Hsieh et al. |
| 2014/0252585 | A1* | 9/2014 | Chen ...................... H01L 23/44 |
| | | | 257/692 |
| 2015/0200151 | A1 | 7/2015 | Lhostis et al. |
| 2018/0366437 | A1 | 12/2018 | Chen et al. |
| 2019/0043771 | A1 | 2/2019 | Chang et al. |
| 2019/0067157 | A1 | 2/2019 | Lin et al. |
| 2019/0148276 | A1 | 5/2019 | Chen et al. |
| 2019/0326257 | A1 | 10/2019 | Agarwal et al. |
| 2019/0327859 | A1* | 10/2019 | Iyengar ................... H05K 3/30 |
| 2020/0006181 | A1 | 1/2020 | Chen et al. |
| 2020/0072565 | A1 | 3/2020 | Klaba et al. |
| 2020/0091113 | A1 | 3/2020 | Chen et al. |
| 2020/0105644 | A1 | 4/2020 | Teng et al. |
| 2020/0176357 | A1 | 6/2020 | Yu et al. |
| 2020/0235061 | A1 | 7/2020 | Elsherbini et al. |
| 2020/0273777 | A1* | 8/2020 | Jain ...................... H01L 21/565 |
| 2021/0035881 | A1* | 2/2021 | Mallik ................... H01L 23/42 |
| 2021/0280497 | A1* | 9/2021 | Brun .................... H01L 23/053 |
| 2023/0268317 | A1 | 8/2023 | Chen et al. |

OTHER PUBLICATIONS

Ozsun, O. et al., "Thermal Performance of a Silicon-Interposer with Embedded Fluid Channels Enabling Dual-Side Heat Removal," 2017 16th IEEE Intersociety Conference on Thermal and Thermomechanical Phenomena in Electronic Systems (ITherm), May 30-Jun. 2, 2017, 7 pages.

Tiwei, T. et al., "High Efficiency Direct Liquid Jet Impingement Cooling of High Power Devices Using a 3D-Shape Polymer Cooler," 2017 IEEE International Electron Devices Meeting (IEDM), Dec. 2-6, 2017, 4 pages.

\* cited by examiner

PACKAGED SEMICONDUCTOR DEVICE INCLUDING LIQUID-COOLED LID AND METHODS OF FORMING THE SAME

PRIORITY CLAIM AND CROSS-REFERENCE

This application is a continuation of U.S. patent application Ser. No. 17/841,007, entitled "Packaged Semiconductor Device Including Liquid-Cooled Lid and Methods of Forming the Same," and filed on Jun. 15, 2022, now U.S. Pat. No. 11,996,351 issued May 28, 2024, which is a continuation of U.S. patent application Ser. No. 17/114,886, entitled "Packaged Semiconductor Device Including Liquid-Cooled Lid and Methods of Forming the Same," and filed on Dec. 8, 2020, now U.S. Pat. No. 11,410,910 issued Aug. 9, 2022, which claims the benefit of U.S. Provisional Application No. 63/058,633, filed on Jul. 30, 2020, and entitled "Semiconductor Device and Manufacturing Method Thereof," which applications are hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is package-on-package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
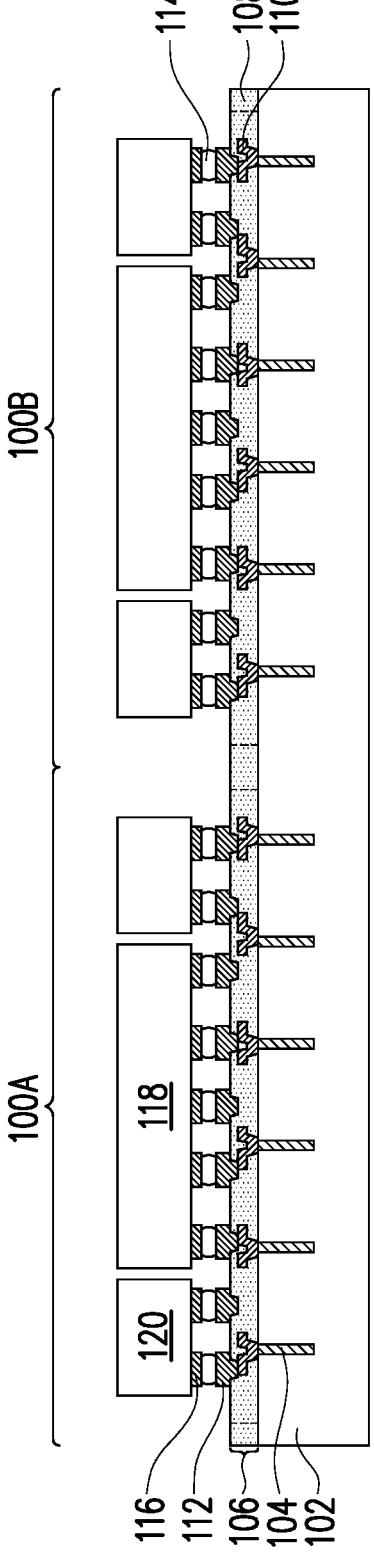
FIGS. 1A through 23 illustrate cross-sectional views of intermediate steps during processes for forming package components, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a packaged semiconductor device, which includes a lid having micro channels which are cooled by a liquid coolant. The lid may be coupled to various integrated circuit dies of the packaged semiconductor device through dielectric-to-dielectric bonding, glass frit bonding, adhesives (e.g., thermal interface materials (TIMs) or other adhesives), or the like. The lid may be formed of a material such as silicon, glass, metal, polymers, or the like, which may be compatible with conventional semiconductor processing apparatuses.

The micro channels included in the lid may include a plurality of micro channels which are parallel to one another or a first plurality of micro channels which are parallel to one another and a second plurality of micro channels which are parallel to one another and perpendicular to the first plurality of micro channels. The micro channels may be rectangular in a cross-sectional view, triangular, U-shaped, or the like. The integrated circuit dies of the packaged semiconductor device may be encapsulated by an encapsulant and attached to a substrate. An area of the lid may be equal to an area of one of the integrated circuit dies; an area of the substrate; a combined area of the encapsulant and the integrated circuit dies; or the like. The micro channels may cover the lid or a portion of the lid. For example, the micro channels may cover an area of the lid equal to an area of one of the integrated circuit dies; an area less than an area of one of the integrated circuit dies; a combined area of the integrated circuit dies and intervening portions of the encapsulant; or the like. The micro channels may be disposed on a surface of the lid opposite the integrated circuit dies and the liquid coolant may be supplied to the micro channels through a cooling cover coupled to the surface of the lid opposite the integrated circuit dies.

Forming the micro channels in the lid and cooling the lid with the liquid coolant improves the cooling capacity of the lid. Coupling the lid to the integrated circuit dies through direct dielectric-to-dielectric bonding improves the thermal conductivity between the lid and the integrated circuit dies, which further improves the cooling capacity of the lid. Forming the lid from silicon or the like may allow processes such as die sawing, wet etching, and the like to be used to form the micro channels, which allows the lid to be formed at a low cost.

Figure 1B:
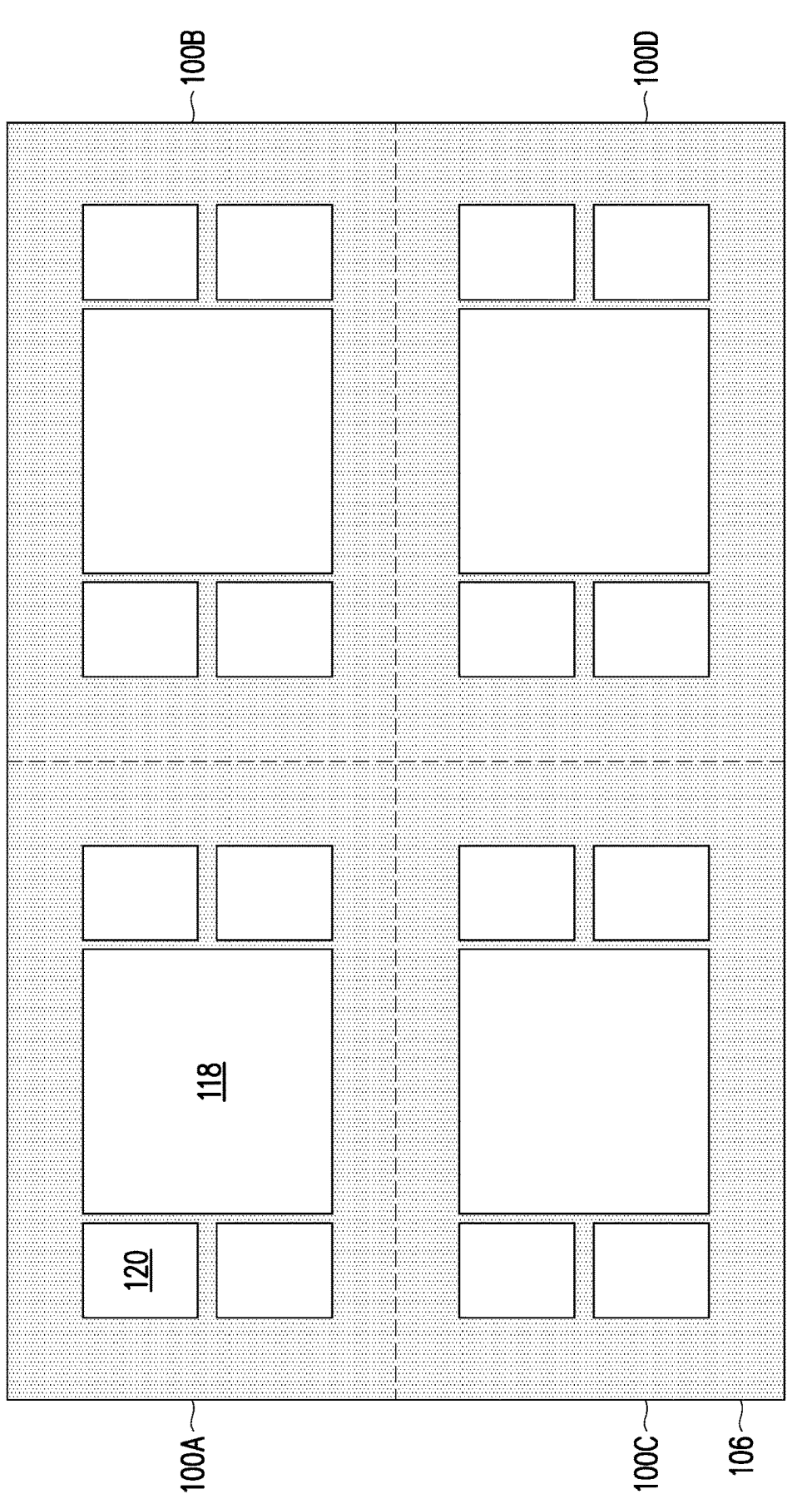

FIGS. 1A and 1B illustrate a cross-sectional view and a top-down view of first integrated circuit dies 118 and second integrated circuit dies 120 bonded to a wafer 102, in accordance with some embodiments. FIGS. 1A and 1B illustrate the wafer 102 as including two device regions 100A-100B and four device regions 100A-100D, respectively, which may be singulated in subsequent steps to form a plurality of semiconductor devices 100. However, the wafer 102 may include any number of the device regions.

The wafer 102 may include a semiconductor substrate, such as silicon, doped or un-doped, or an active layer of a semiconductor-on-insulator (SOI) substrate. The wafer 102 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. In some embodiments, the wafer 102 may be an interposer wafer, with each of the device regions 100A-100B being subsequently singulated to form an interposer. In embodiments in which the wafer 102 is an interposer wafer, the wafer 102 may be free from active devices and may provide interconnections between the first integrated circuit dies 118 and the second integrated circuit dies 120. The interposer wafer may include optional passive devices. The wafer 102 includes a front-side (e.g., the surface facing upwards in FIG. 1A) and a backside (e.g., the surface facing downwards in FIG. 1A).

Devices may be formed at the front-side (e.g. at an active surface) of the wafer 102. The devices may include optional active devices (e.g., transistors, diodes, or the like), capacitors, resistors, or the like. In some embodiments, the backside (e.g., an inactive surface) may be free from the devices. An inter-layer dielectric (ILD) may be formed over the front-side of the wafer 102. The ILD may surround and cover the devices. The ILD may include one or more dielectric layers formed of materials such as phospho-silicate glass (PSG), boro-silicate glass (BSG), boron-doped phospho-silicate glass (BPSG), un-doped silicate glass (USG), or the like.

An interconnect structure 106 may be formed over the front-side of the wafer 102. The interconnect structure 106 may interconnect the devices at the front-side of the wafer 102 and may provide interconnections between the first integrated circuit dies 118 and the second integrated circuit dies 120 bonded to the wafer 102 in each of the device regions 100A-100D. The interconnect structure 106 may comprise one or more layers of first conductive features 110 formed in one or more stacked first dielectric layers 108. Each of the stacked first dielectric layers 108 may comprise a dielectric material, such as a low-k dielectric material, an extra low-k (ELK) dielectric material, or the like. The first dielectric layers 108 may be deposited using an appropriate process, such as, chemical vapor deposition (CVD), atomic layer deposition (ALD), physical vapor deposition (PVD), plasma-enhanced chemical vapor deposition (PECVD), or the like.

The first conductive features 110 may comprise conductive lines and conductive vias interconnecting the layers of conductive lines. The conductive vias may extend through respective ones of the first dielectric layers 108 to provide vertical connections between layers of the conductive lines. The first conductive features 110 may be formed through any acceptable process, such as, a damascene process, a dual damascene process, or the like.

In some embodiments, the first conductive features 110 may be formed using a damascene process in which a respective first dielectric layer 108 is patterned utilizing a combination of photolithography and etching techniques to form trenches corresponding to the desired pattern of the first conductive features 110. An optional diffusion barrier and/or optional adhesion layer may be deposited and the trenches may then be filled with a conductive material. Suitable materials for the barrier layer include titanium, titanium nitride, titanium oxide, tantalum, tantalum nitride, titanium oxide, combinations thereof, or the like, and suitable materials for the conductive material include copper, silver, gold, tungsten, aluminum, ruthenium, cobalt, molybdenum, combinations thereof, or the like. In some embodiments, the first conductive features may be deposited by front-end-of-line (FEOL) processes, which allows for high-temperature materials to be used for the conductive material. In an embodiment, the first conductive features 110 may be formed by depositing a seed layer of copper or a copper alloy, and filling the trenches by electroplating. A chemical mechanical planarization (CMP) process or the like may be used to remove excess conductive material from a surface of the respective first dielectric layer 108 and to planarize surfaces of the first dielectric layer 108 and the first conductive features 110 for subsequent processing.

Although the interconnect structure 106 is illustrated in FIG. 1A as extending across a surface of the wafer 102, in some embodiments, individual interconnect structures 106 may be formed in each of the device regions 100A-100D and the individual interconnect structures 106 may be separated from one another. For example, as illustrated by dashed lines in the first dielectric layers 108 of FIG. 1A, the interconnect structure 106 may be separated into individual interconnect structures 106 in each of the device regions 100A-100B. The interconnect structure 106 may be separated using a suitable etching process, such as an isotropic etching process (e.g., a wet etching process), an anisotropic etching process (e.g., a dry etching process), multiple processes or combinations thereof, or the like.

Conductive vias 104 may be formed extending into the wafer 102. The conductive vias 104 may be electrically coupled to the first conductive features 110 of the interconnect structure 106. As an example, the conductive vias 104 may be formed by forming recesses in the wafer 102 by, for example, etching, milling, laser techniques, a combination thereof, or the like. A thin dielectric material may be formed in the recesses, such as by using an oxidation technique. A barrier layer may be conformally deposited in the openings, such as by CVD, ALD, PVD, thermal oxidation, a combination thereof, or the like. The barrier layer may be formed from an oxide, a nitride, or an oxynitride, such as titanium nitride, titanium oxynitride, tantalum nitride, tantalum oxynitride, tungsten nitride, a combination thereof, and/or the like. A conductive material may be deposited over the barrier layer and in the openings. The conductive material may be formed by an electro-chemical plating process, CVD, PVD, a combination thereof, or the like. Examples of conductive materials are copper, tungsten, aluminum, silver, gold, a combination thereof, or the like. Excess of the conductive material and the barrier layer is removed from the surface of the wafer 102 by, for example, a CMP or the like. Remaining portions of the barrier layer and the conductive material form the conductive vias 104.

In the embodiment illustrated, the conductive vias 104 are not yet exposed at the backside of the wafer 102. Rather, the conductive vias 104 are buried in the wafer 102. As will be discussed in greater detail below, the conductive vias 104 will be exposed at the backside of the wafer 102 in subsequent processing. After exposure, the conductive vias 104 can be referred to as through-silicon vias or through-substrate vias (TSVs).

Further in FIG. 1A, bond pads 112 are formed for external connection to the interconnect structure 106. The bond pads 112 include bump portions on and extending along a major surface of a topmost layer of the first dielectric layers 108. The bond pads 112 further include via portions extending through the topmost layer of the first dielectric layers 108. The via portions may physically contact and be electrically coupled to the first conductive features 110. As a result, the bond pads 112 may be electrically coupled to the devices formed in the wafer 102 and the conductive vias 104. The bond pads 112 may be formed of the same materials and by the same processes as the first conductive features 110.

Conductive connectors 114 are formed over the bond pads 112. The conductive connectors 114 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 114 may include a conductive material such as solder, copper, aluminum, gold, nickel, silver, palladium, tin, the like, or a combination thereof. In some embodiments, the conductive connectors 114 are formed by initially forming a layer of solder through evaporation, electroplating, printing, solder transfer, ball placement, or the like. Once the layer of solder has been formed, a reflow may be performed in order to shape the material into the desired bump shapes. In some embodiments, the conductive connectors 114 comprise metal pillars (such as copper pillars), which may be formed by sputtering, printing, electroplating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

The first integrated circuit dies 118 and the second integrated circuit dies 120 are coupled to the wafer 102. As illustrated in FIG. 1B, one of the first integrated circuit dies 118 and four of the second integrated circuit dies 120 may be coupled in each of the device regions 100A-100D. However, any number of the first integrated circuit dies 118 and the second integrated circuit dies 120 may be formed in each of the device regions 100A-100D. Although the first integrated circuit dies 118 and the second integrated circuit dies 120 are illustrated as having the same heights, each of the first integrated circuit dies 118 and the second integrated circuit dies 120 may having varying heights.

Each of the first integrated circuit dies 118 and the second integrated circuit dies 120 may include bond pads 116, which are formed on a front-side (e.g., an active surface) thereof. The bond pads 116 may be the same as or similar to the bond pads 112. The first integrated circuit dies 118 and the second integrated circuit dies 120 may be mechanically and electrically bonded to the wafer 102 by way of the bond pads 116, the conductive connectors 114, and the bond pads 112. The first integrated circuit dies 118 and the second integrated circuit dies 120 may be placed over the wafer 102 and a reflow process may be performed to reflow the conductive connectors 114 and bond the bond pads 112 to the bond pads 116 through the conductive connectors 114.

Each of the first integrated circuit dies 118 and the second integrated circuit dies 120 may be a logic die (e.g., a central processing unit (CPU), a graphics processing unit (GPU), a system-on-a-chip (SoC), an application processor (AP), a microcontroller, or the like), a memory die (e.g., a dynamic random access memory (DRAM) die, a static random access memory (SRAM) die, a high bandwidth memory (HBM) die, or the like), a power management die (e.g., a power management integrated circuit (PMIC) die), a radio frequency (RF) die, a sensor die, a micro-electro-mechanical-system (MEMS) die, a signal processing die (e.g., a digital signal processing (DSP) die or the like), a front-end die (e.g., an analog front-end (AFE) die), the like, or a combination thereof. In some embodiments, the first integrated circuit dies 118 may be SoCs and the second integrated circuit dies 120 may be HBM dies.

Figure 2:
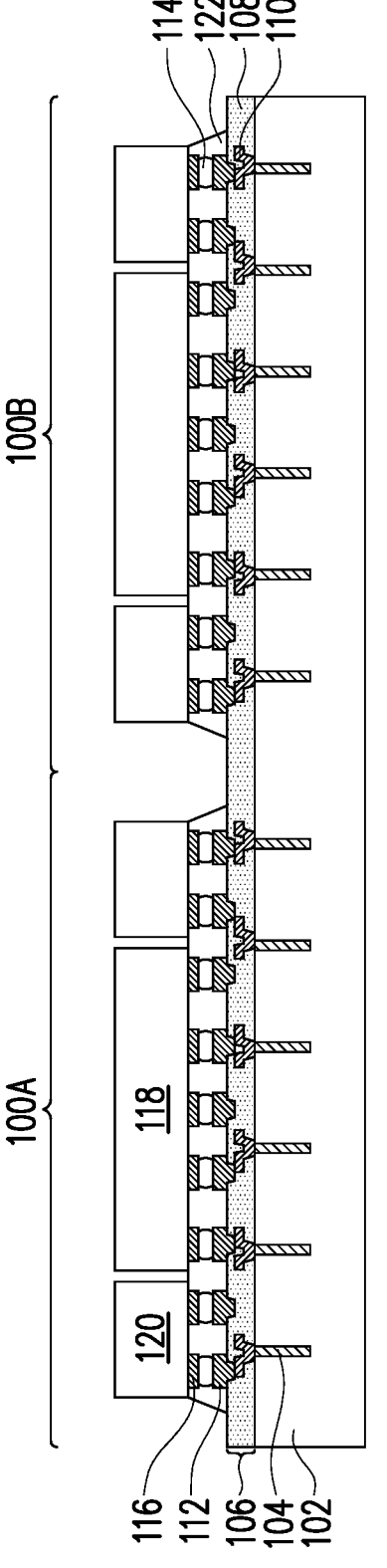

In FIG. 2, an underfill 122 is formed between the first integrated circuit dies 118 and the second integrated circuit dies 120 and the interconnect structure 106, surrounding the bond pads 112, the bond pads 116, and the conductive connectors 114. The underfill 122 may reduce stress and protect the joints resulting from the reflowing of the conductive connectors 114. The underfill 122 may be formed by a capillary flow process after the first integrated circuit dies 118 and the second integrated circuit dies 120 are attached, or may be formed by a suitable deposition method before the first integrated circuit dies 118 and the second integrated circuit dies 120 are attached.

Figure 3:
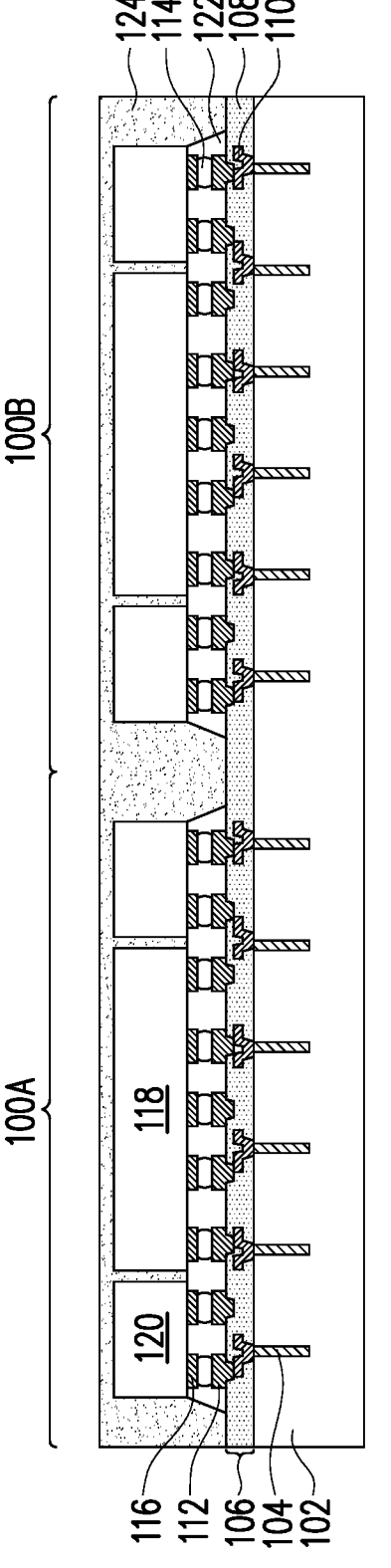

In FIG. 3, an encapsulant 124 is formed on and around the various components. After formation, the encapsulant 124 encapsulates the first integrated circuit dies 118, the second integrated circuit dies 120, and the underfill 122. In embodiments in which individual interconnect structures 106 are included in each of the device regions 100A-100B, the encapsulant may further encapsulate the interconnect structures 106. The encapsulant 124 may be a molding compound, epoxy, or the like. The encapsulant 124 may be applied by compression molding, transfer molding, or the like, and may be formed over the wafer 102 such that the first integrated circuit dies 118 and/or the second integrated circuit dies 120 are buried or covered. The encapsulant 124 may further be formed in gap regions between the first integrated circuit dies 118 and/or the second integrated circuit dies 120. The encapsulant 124 may be applied in liquid or semi-liquid form and then subsequently cured.

Figure 4:
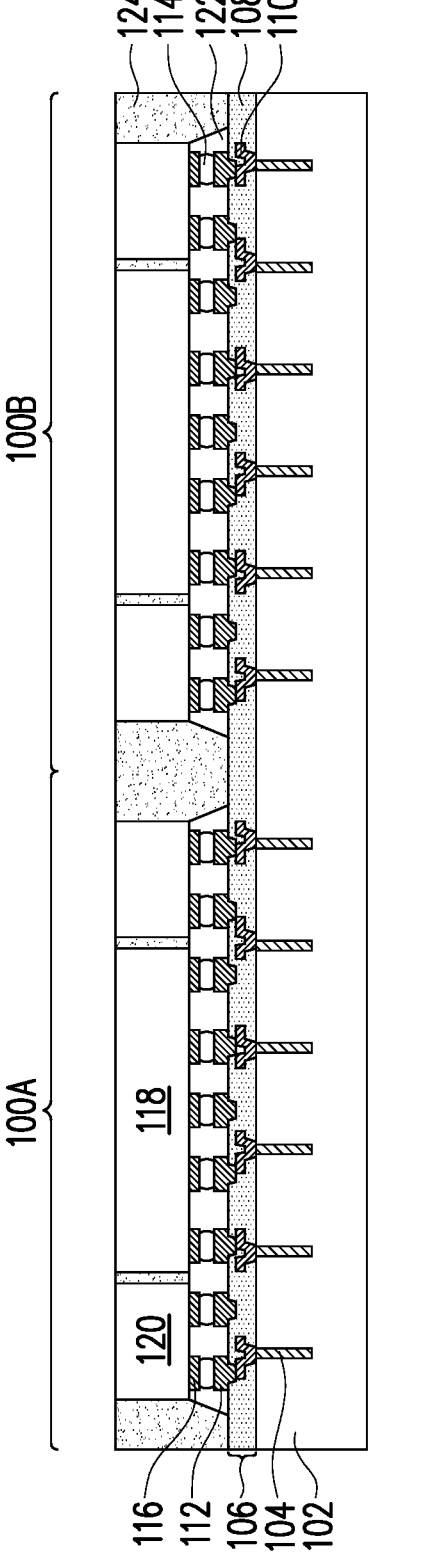

In FIG. 4, a planarization process is performed on the encapsulant 124 to expose the first integrated circuit dies 118 and the second integrated circuit dies 120. The planarization process may also remove material of the first integrated circuit dies 118 and/or the second integrated circuit dies 120 until the first integrated circuit dies 118 and the second integrated circuit dies 120 are exposed. Top surfaces of the first integrated circuit dies 118, the second integrated circuit dies 120, and the encapsulant 124 may be substantially coplanar (e.g., level) after the planarization process, within process variations. The planarization process may be, for example, a chemical-mechanical polish (CMP), a grinding process, or the like. In some embodiments, the planarization may be omitted, for example, if the first integrated circuit dies 118 and/or the second integrated circuit dies 120 are already exposed.

Figure 5:
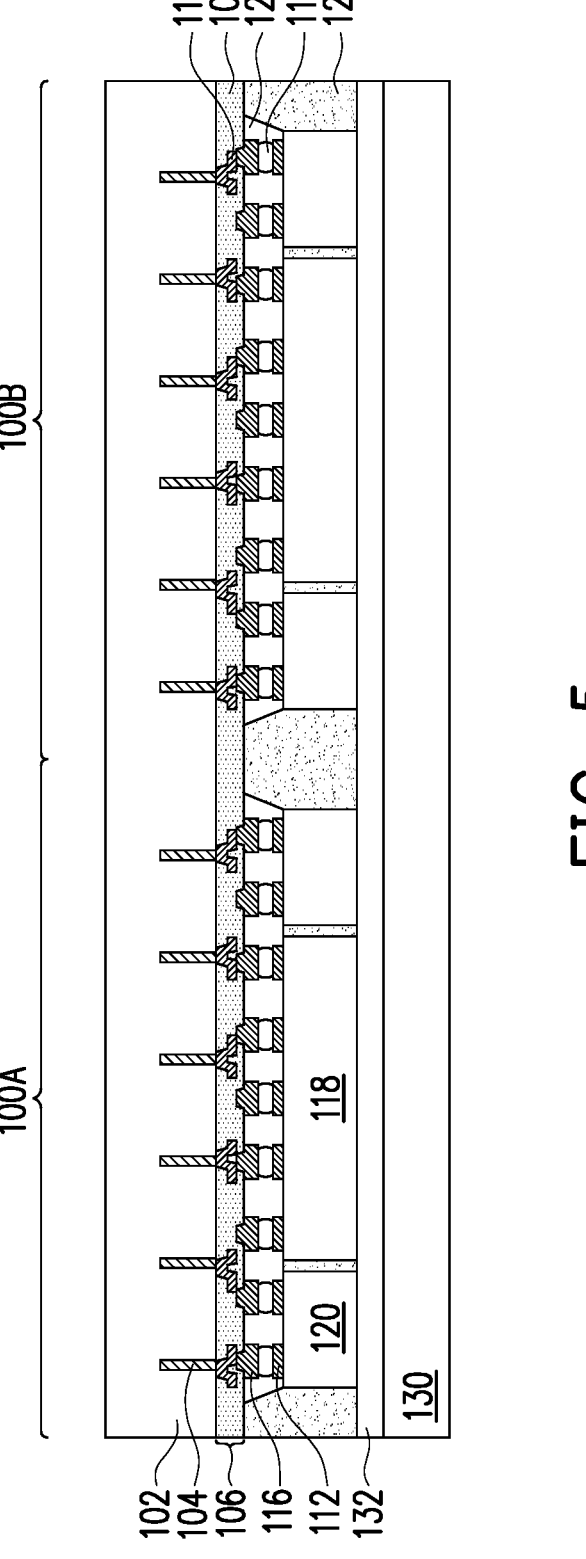

In FIG. 5, a carrier substrate 130 is bonded to the encapsulant 124, the first integrated circuit dies 118, and the second integrated circuit dies 120 through a release layer 132. The carrier substrate 130 may be a glass carrier substrate, a ceramic carrier substrate, or the like. The carrier substrate 130 may be a wafer, such that multiple packages can be formed on the carrier substrate 130 simultaneously.

The release layer 132 may be formed of a polymer-based material, which may be removed along with the carrier substrate 130 from the overlying structures that will be formed in subsequent steps. In some embodiments, the release layer 132 is an epoxy-based thermal-release material, which loses its adhesive property when heated, such as a light-to-heat-conversion (LTHC) release coating. In other embodiments, the release layer 132 may be an ultra-violet (UV) glue, which loses its adhesive property when exposed to UV lights. The release layer 132 may be dispensed as a liquid and cured, may be a laminate film laminated onto the carrier substrate 130, or may be the like. The top surface of the release layer 132 may be leveled and may have a high degree of planarity. Further in FIG. 5, after the carrier substrate 130 is bonded to the encapsulant 124, the first integrated circuit dies 118, and the second integrated circuit dies 120, the device may be flipped such that a backside of the wafer 102 faces upwards.

Figure 6:
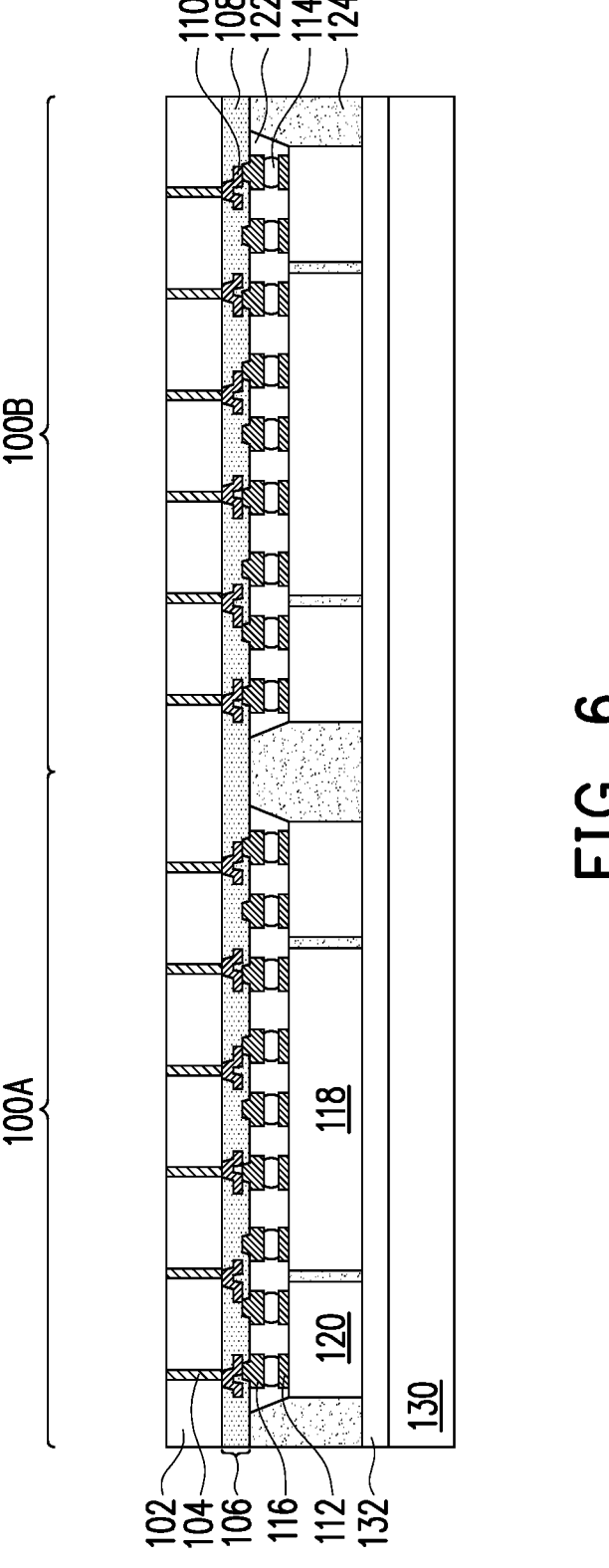

In FIG. 6, the wafer 102 is thinned. The thinning may be by a CMP process, a grinding process, an etch-back process, a combination thereof, or the like. The thinning is performed on the backside surface of the wafer 102. The thinning exposes the conductive vias 104. After the thinning, surfaces of the conductive vias 104 and the backside surface of the wafer 102 are coplanar (e.g., level) within process variations. The exposed conductive vias 104 may be referred to as through substrate vias or through silicon vias (TSVs). After the wafer 102 is thinned, the conductive vias 104 may provide electrical connections through the substrate of the wafer 102.

Figure 7:
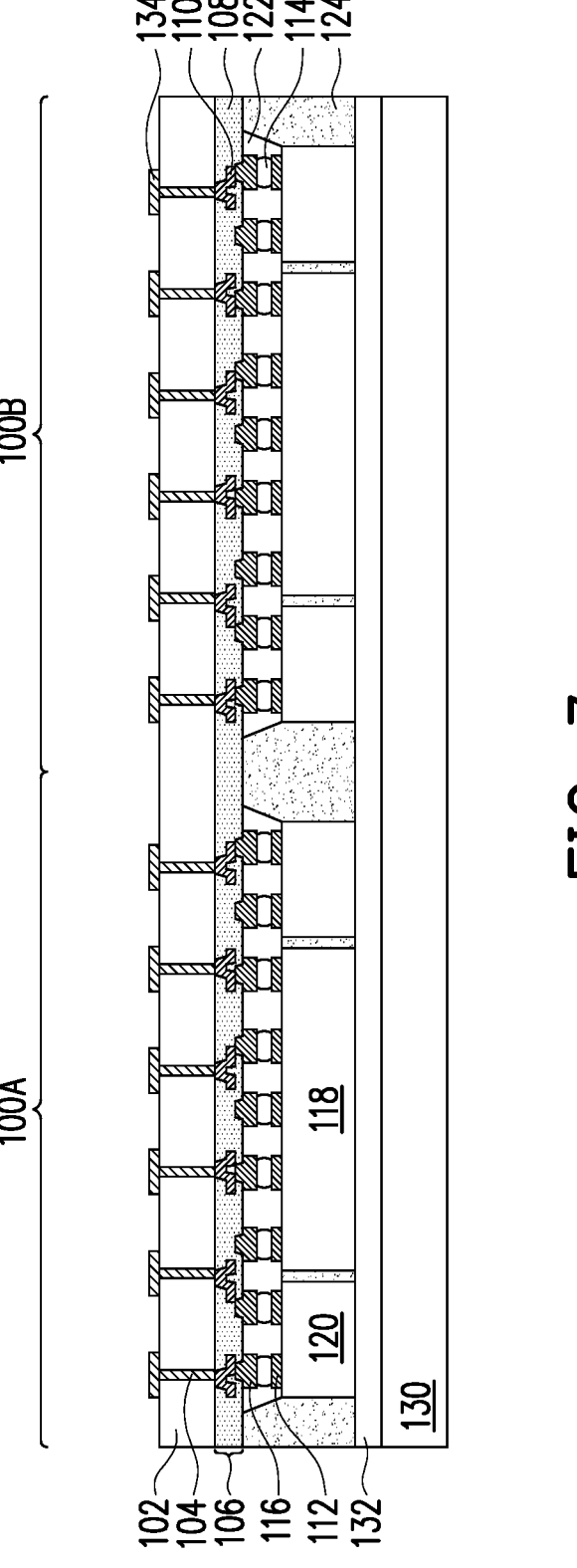

In FIG. 7, die connectors 134 are formed at the backside of the wafer 102. The die connectors may be in physical contact with and electrically coupled to the conductive vias 104. The die connectors 134 may be conductive pillars, pads, or the like, to which external connections are made. The die connectors 134 can be formed of a metal, such as copper, aluminum, or the like, and can be formed by, for example, plating, or the like. The die connectors 134 are electrically connected to devices formed in the wafer 102 and the interconnect structure 106.

Figure 8:
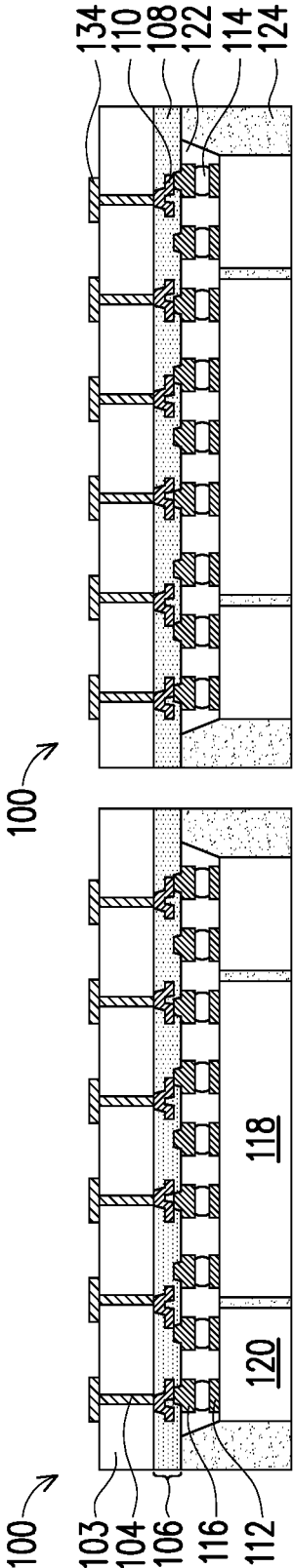

In FIG. 8, a singulation process is performed by sawing along scribe line regions, for example, between the device regions 100A-100B (see FIG. 7). The sawing singulates individual semiconductor devices 100 from one another. The resulting, singulated semiconductor devices 100 may be from any of the device regions 100A-100B. The singulation process singulates the wafer 102 to form substrates 103. The singulation process may also saw through the encapsulant 124 and the interconnect structure 106.

Further in FIG. 8, a carrier substrate de-bonding is performed to detach (or "de-bond") the carrier substrate 130 from the encapsulant 124, the first integrated circuit dies 118, and the second integrated circuit dies 120. In some embodiments, the de-bonding includes projecting a light, such as a laser light or an UV light, on the release layer 132 so that the release layer 132 decomposes under the heat of the light and the carrier substrate 130 can be removed. The carrier substrate de-bonding may be performed before or after the singulation process is performed.

Figure 9A:
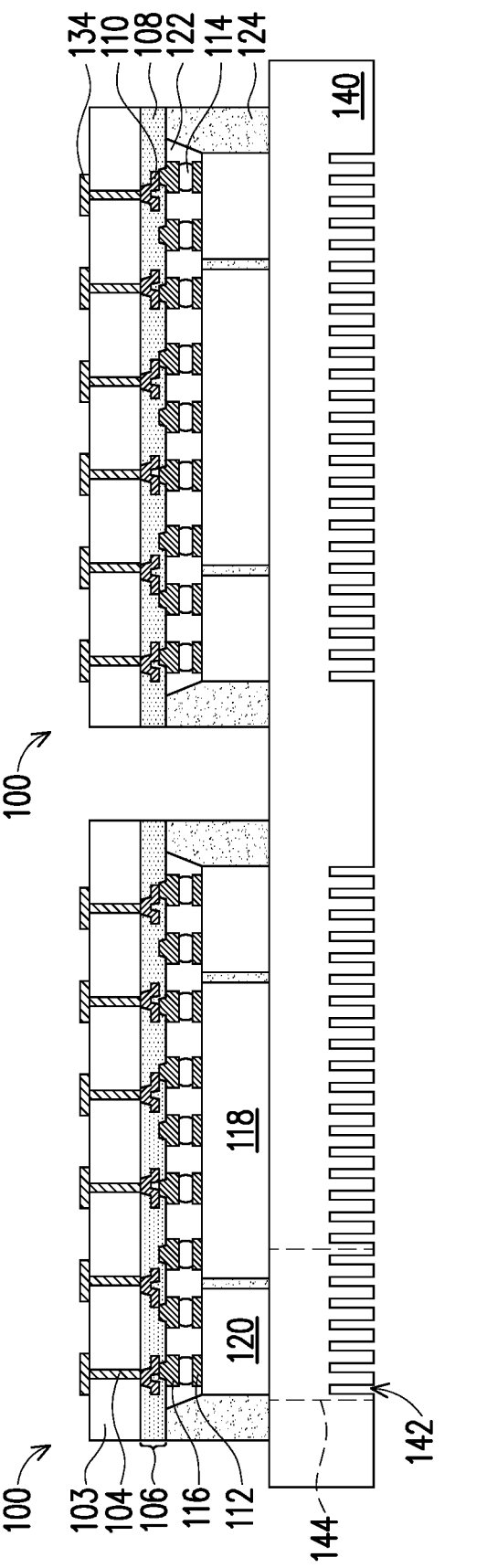

In FIG. 9A, a lid 140 is attached to the semiconductor devices 100. As illustrated in FIG. 9A, the lid 140 may be attached to the encapsulant 124 and backsides of the first integrated circuit dies 118 and the second integrated circuit dies 120. In some embodiments, the lid 140 may comprise materials such as silicon, glass, a metal, a polymer, or the like. The lid 140 may have a thickness ranging from about 10 μm to about 10,000 μm. The semiconductor devices 100 may be bonded to the lid 140 by fusion bonding or the like. In some embodiments, the semiconductor devices 100 may be bonded to the lid 140 through dielectric-to-dielectric bonding, without using any adhesive material (e.g., die attach film). The bonding may include a pre-bonding and an annealing. During the pre-bonding, a small pressing force is applied to press the semiconductor devices 100 against the lid 140. The pre-bonding is performed at a low temperature, such as room temperature (e.g., a temperature in the range of about 15° C. to about 30° C.). In some embodiments, an oxide, such as a native oxide, is formed at the back side of the lid 140 and is used for the bonding. The bonding strength is then improved in a subsequent annealing step, in which the semiconductor devices 100 and the lid 140 are annealed at a high temperature, such as a temperature in the range of about 100° C. to about 400° C. After the annealing, bonds, such as fusion bonds, are formed bonding the semiconductor devices 100 to the lid 140. For example, the bonds can be covalent bonds between the semiconductor devices 100 and the lid 140. Bonding the lid 140 directly to the first integrated circuit dies 118 and the second integrated circuit dies 120 through fusion bonding may decrease thermal resistance between the lid and the first integrated circuit dies 118 and the second integrated circuit dies 120, which may improve the cooling capacity of the lid 140.

In some embodiments, the lid 140 may be coupled to the semiconductor devices through an adhesive. The lid 140 may be coupled to the semiconductor devices 100 through the adhesive in combination with the dielectric-to-dielectric bonding, or in lieu of the dielectric-to-dielectric bonding. The adhesive may be a thermal interface material (TIM) or other adhesive. The TIM may be an adhesive material having good thermal conductivity. The adhesive may be any suitable adhesive, epoxy, die attach film (DAF), or the like. The adhesive may be deposited between the lid 140 and any of the encapsulant 124, the first integrated circuit dies 118, and/or the second integrated circuit dies 120.

In some embodiments, the lid 140 may be coupled to the semiconductor devices 100 through glass frit bonding. The lid 140 may be coupled to the semiconductor devices 100 through glass frit bonding in combination with the dielectric-to-dielectric bonding, or in lieu of the dielectric-to-dielectric bonding. The glass frit bonding may include depositing a glass material, such as a glass paste, a glass solder or the like, between the lid 140 and the semiconductor devices 100 and heating the glass material to reflow the glass material. The glass material may be deposited between the lid 140 and any of the encapsulant 124, the first integrated circuit dies 118, and/or the second integrated circuit dies 120.

Figure 9B:
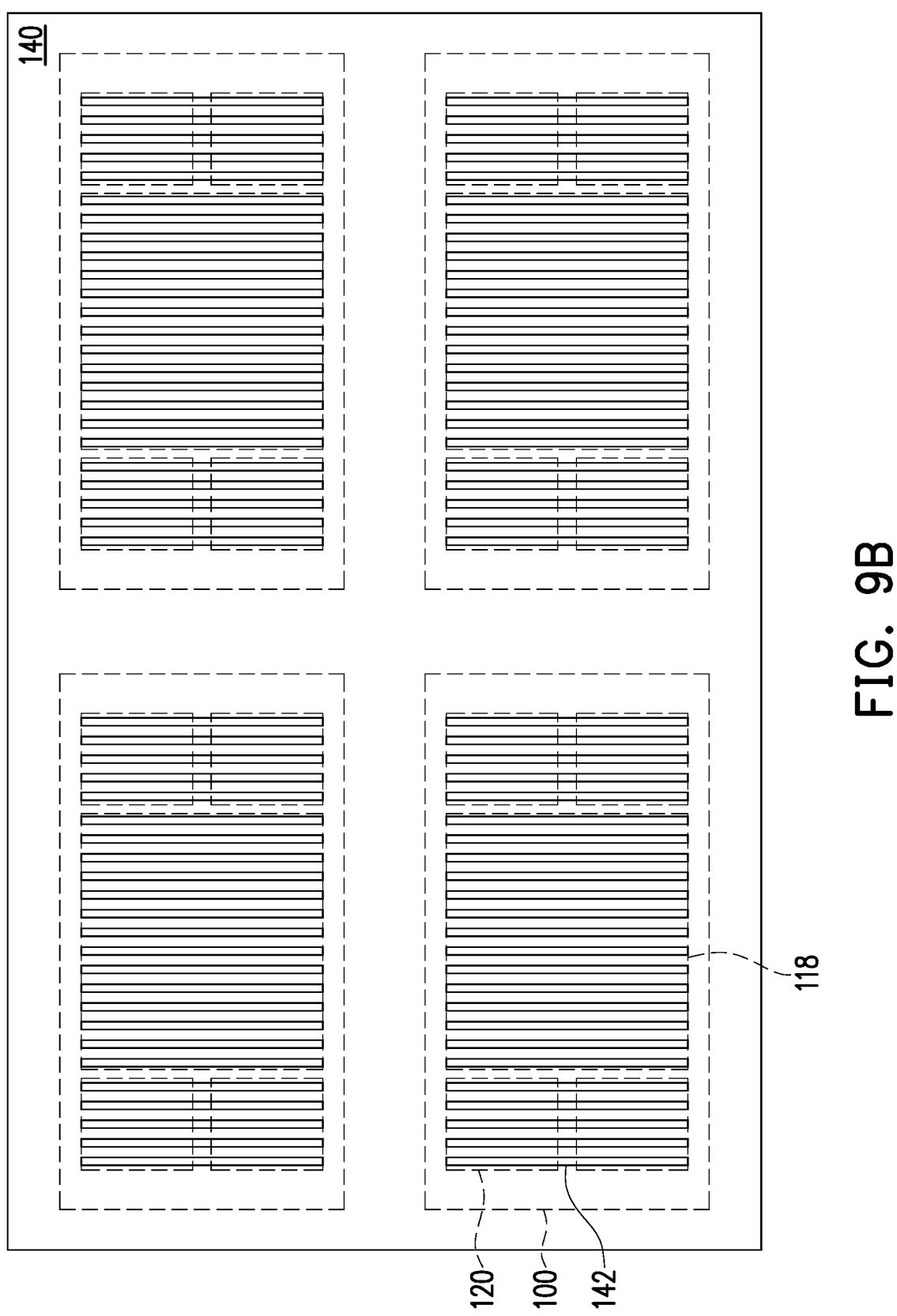

As illustrated in FIGS. 9A and 9B, the lid 140 may include channels 142 formed in a surface of the lid 140 opposite a surface to which the semiconductor devices 100 are bonded. FIGS. 9B through 9L illustrate various views of the lid 140 including various channels 142-142F in accordance with some embodiments. Locations of the first integrated circuit dies 118, the second integrated circuit dies 120, and the semiconductor devices 100 are illustrated by dashed lines in the planar views of the lid 140 provided in FIGS. 9B, 9I, 9K, and 9L. In FIG. 9B, each of the channels 142 are parallel to one another. In the embodiment illustrated in FIG. 9B, an area covered by the channels 142 may be the same as an area covered by the first integrated circuit dies 118 and the second integrated circuit dies 120 of each of the semiconductor devices 100. As such, a perimeter of the channels 142 may be aligned with a perimeter including the first integrated circuit dies 118 and the second integrated circuit dies 120 in each of the semiconductor dies 100. Outermost sidewalls of the channels 142 may be aligned with two sidewalls of each of the first integrated circuit dies 118 and the second integrated circuit dies 120.

Figures 9C, 9D, 9E:
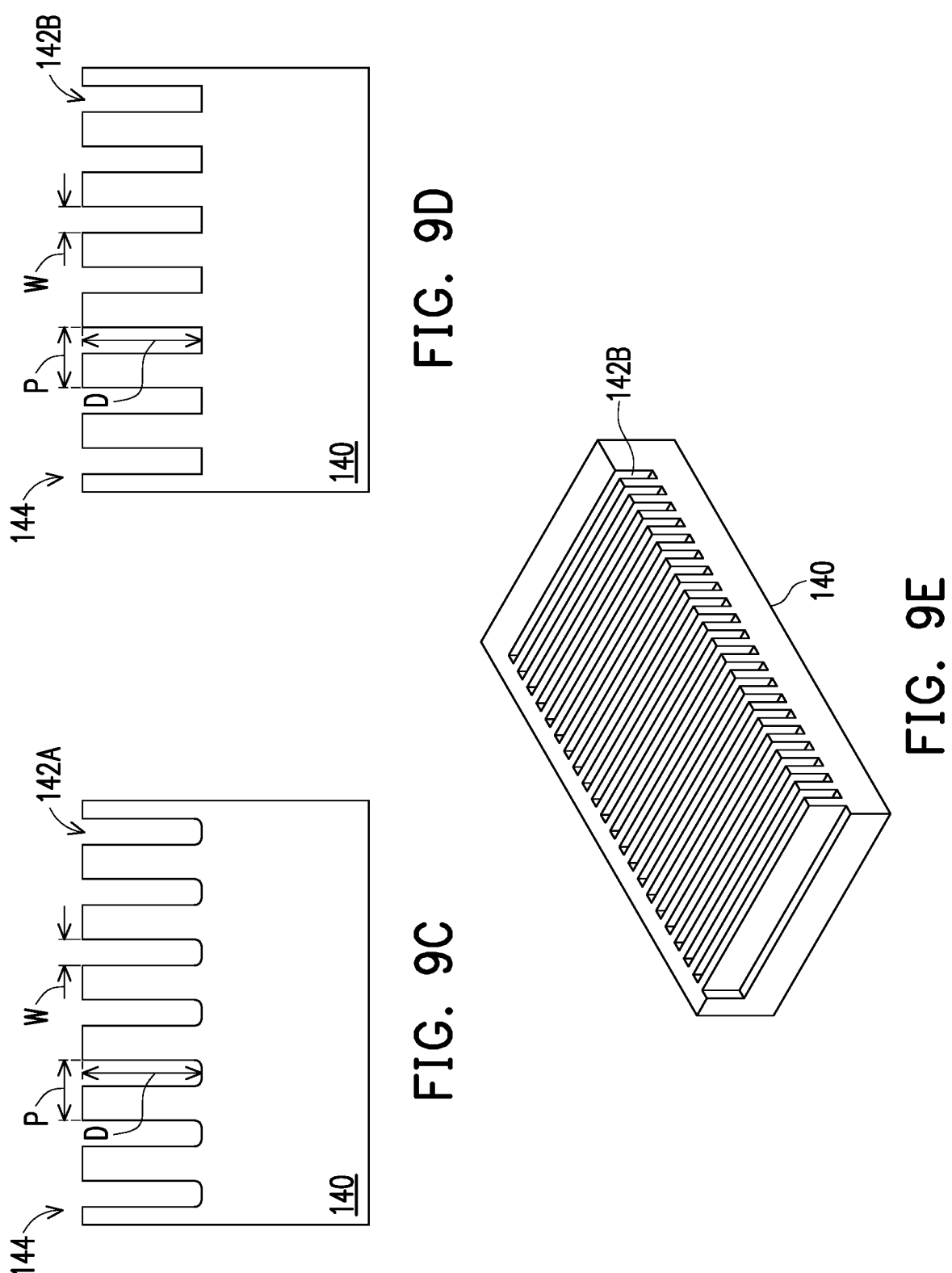
Figures 9F, 9G, 9H:
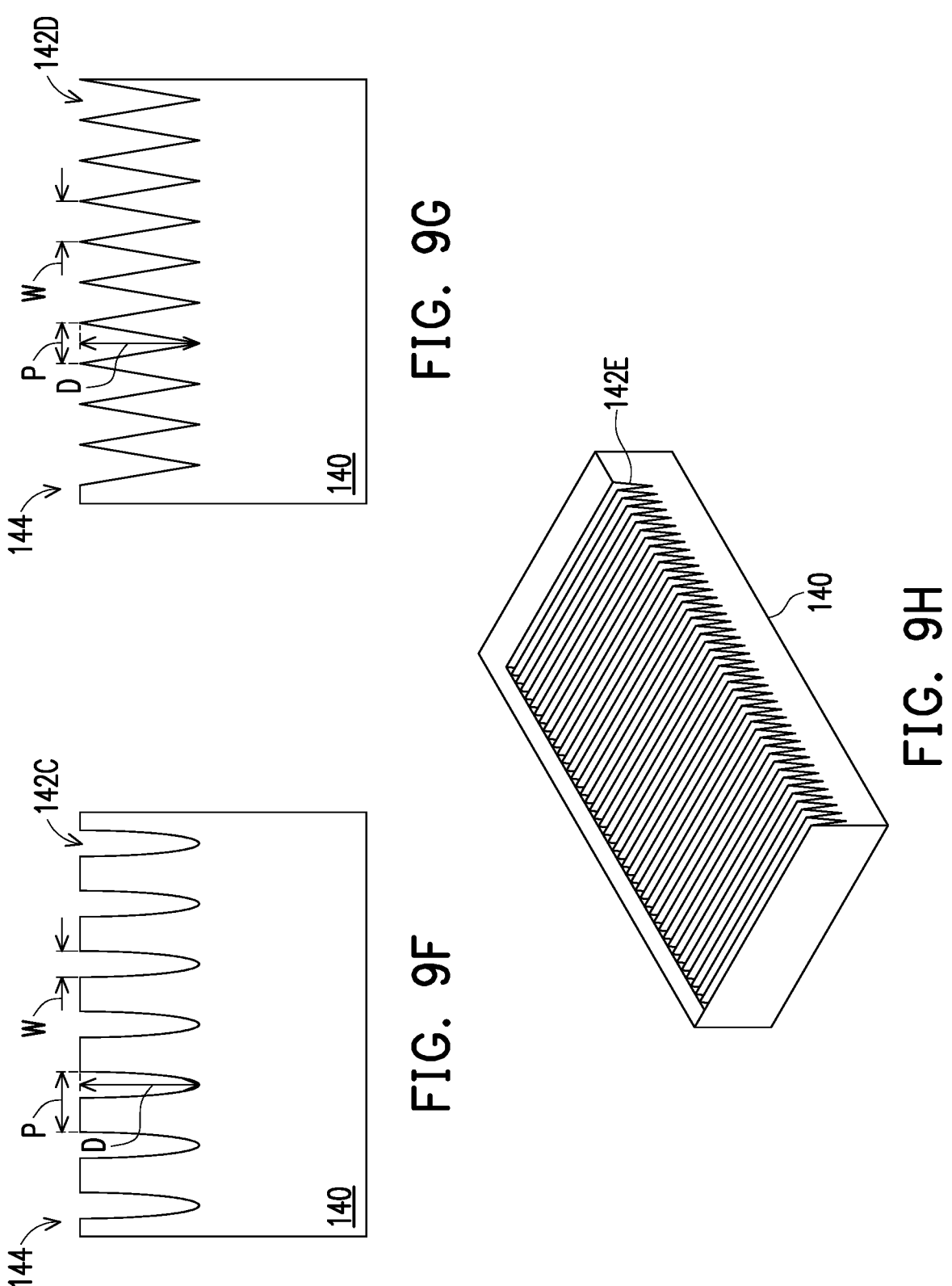

FIGS. 9C, 9D, 9F, and 9G illustrate detailed cross-sectional views of region 144 of FIG. 9A. FIGS. 9E and 9H illustrate perspective views of a cut-away portion of the lid 140. FIGS. 9C through 9H illustrate various profiles of the channels 142, in accordance with some embodiments. In FIG. 9C, channels 142A have substantially vertical sidewalls and substantially rectangular cross-sections with rounded edges. The channels 142A may be U-shaped. In FIGS. 9D and 9E, channels 142B have substantially vertical sidewalls and are substantially rectangular. The channels 142A and the channels 142B may be formed by a mechanical process, such as mechanical die sawing or the like. The shape of the channels 142A and the channels 142B may be controlled by controlling the parameters of the mechanical die sawing and selecting an appropriate blade for the mechanical die sawing. In FIG. 9F, channels 142C are U-shaped in a cross-sectional view and may taper in width in a direction towards the surface of the lid 140 to which the semiconductor devices 100 are coupled. The channels 142C may be formed by laser cutting or the like. The channels 142D may be triangle-shaped in a cross-sectional view and may taper in width in a direction towards the surface of the lid 140 to which the semiconductor devices 100 are coupled. The channels 142D may be formed using acceptable photolithography and etching techniques. In some embodiments, the etching techniques may include isotropic etching, such as wet etching or the like. In some embodiments, an etchant used to form the channels 142D may comprise potassium hydroxide (KOH). The channels 142 may have widths W from about 1 μm to about 2,000 μm, depths D from about 1 μm to about 10,000 μm, and pitches P from about 1.1 μm to about 10,000 μm.

Figure 9I:
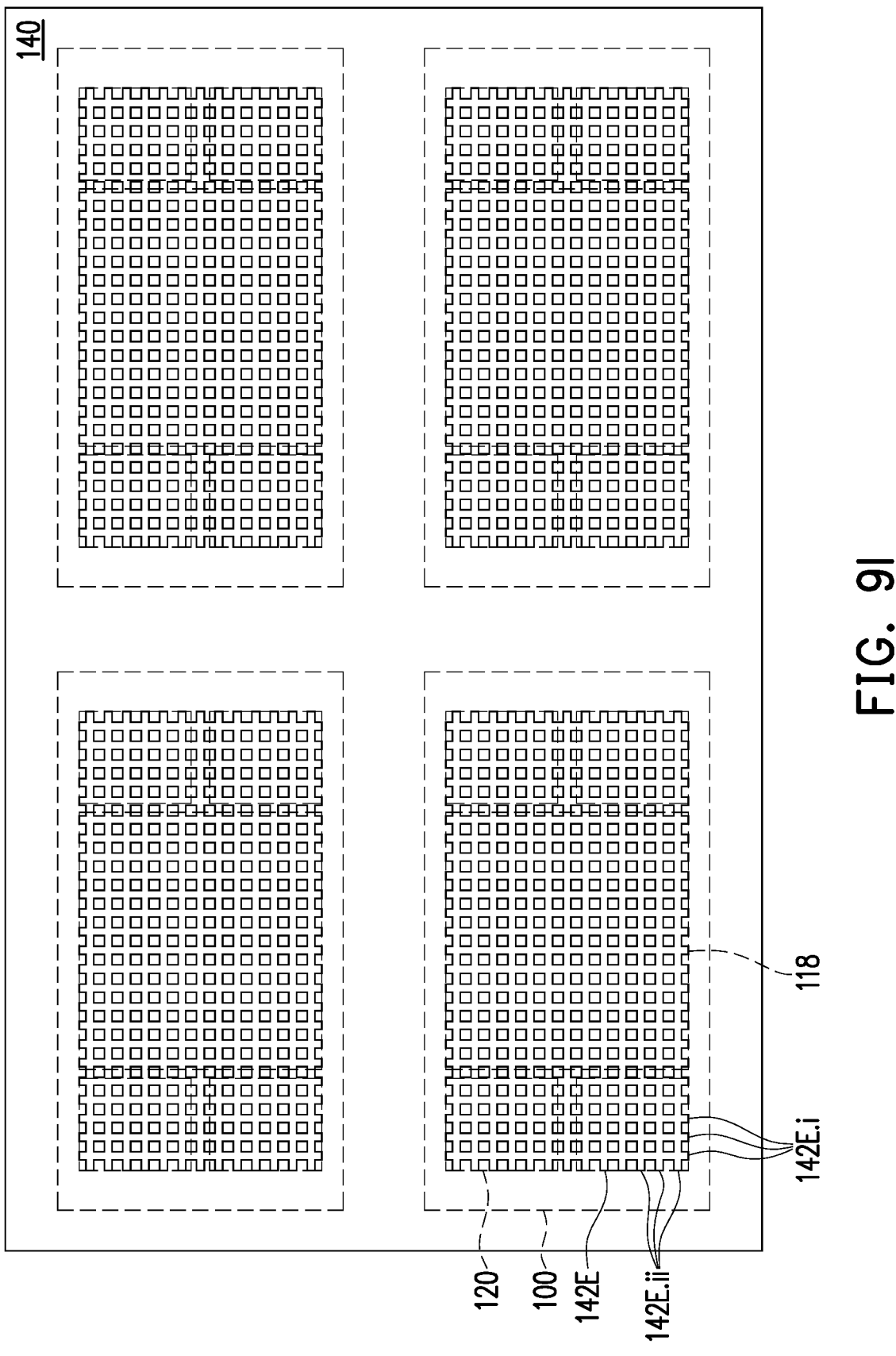
Figure 9J:
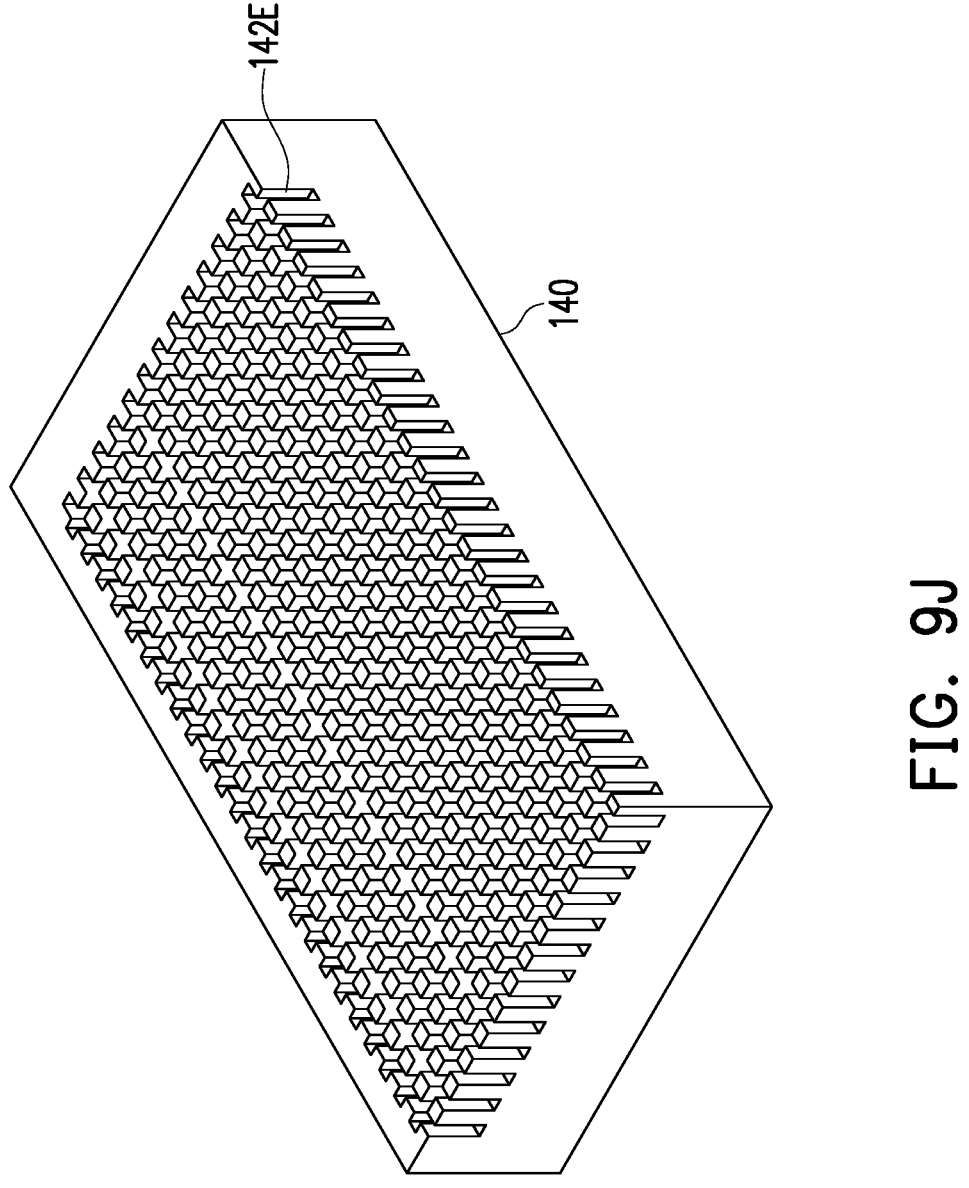

FIGS. 9I and 9J illustrate a bottom-up view of the lid 140 and a perspective view of a cut-away portion of the lid 140. In FIGS. 9I and 9J, channels 142E formed in the lid 140 include first channels 142E.i, which are each parallel to one another and second channels 142E.ii which are each parallel to one another and perpendicular to the first channels 142E.i. The channels 142E may be formed by any of the methods used to form the channels 142-142D and may include any of the profiles discussed above with respect to FIGS. 9C through 9H.

Figure 9K:
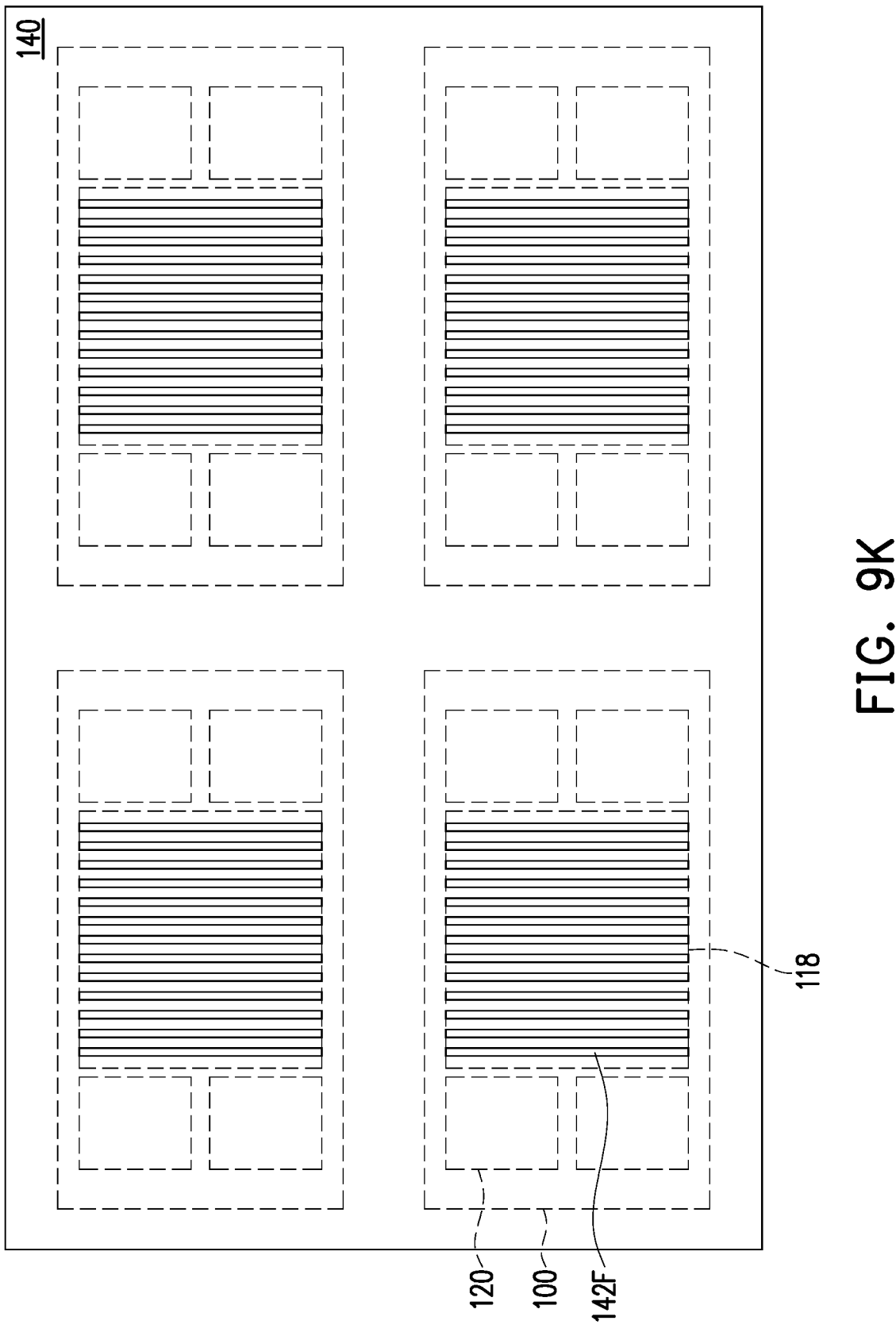
Figure 9L:
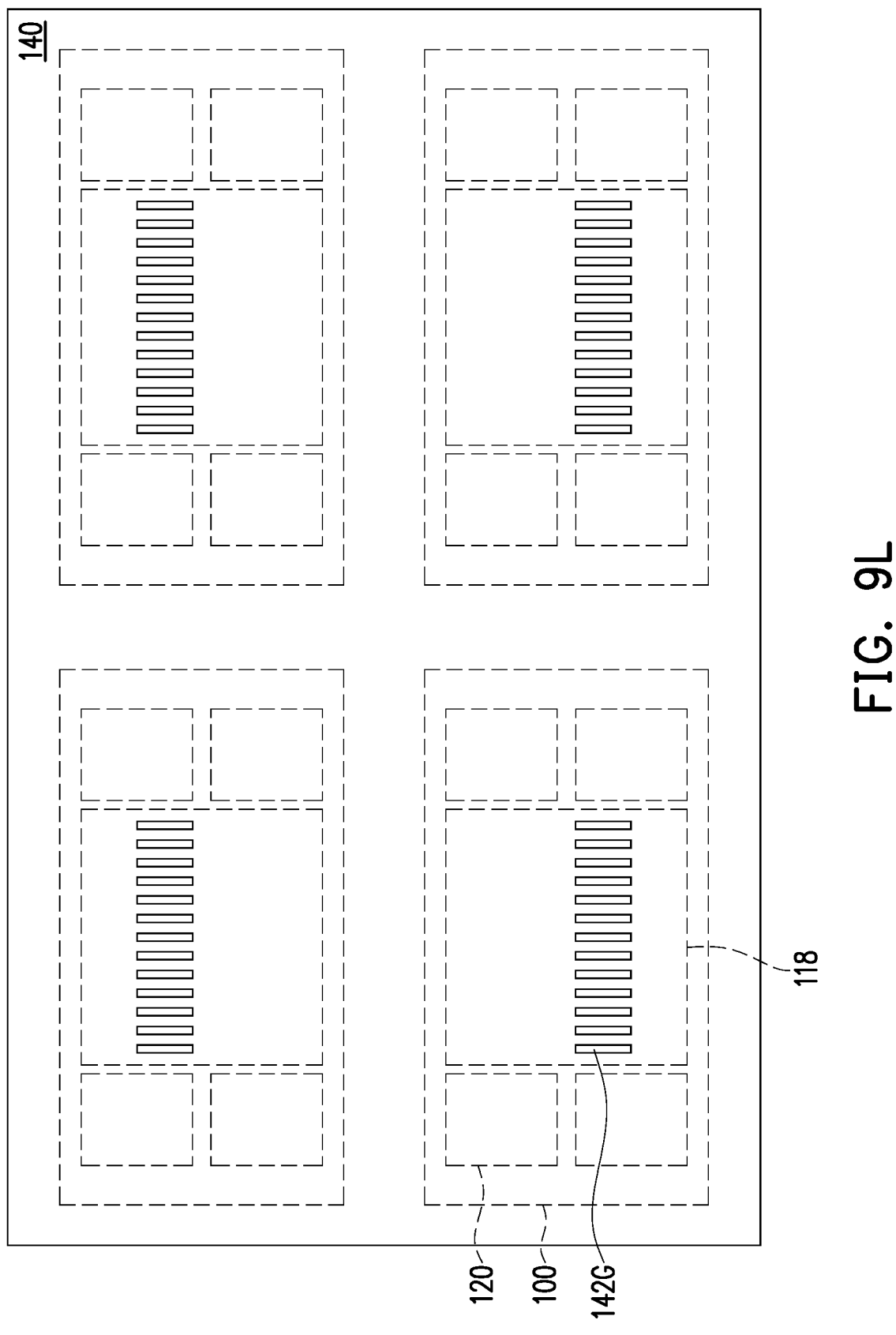

In FIGS. 9K and 9L, channels 142F and 142G are formed in different areas of the lid 140 than the above-described embodiments. In FIG. 9K, the channels 142F may cover an area of the lid 140 equal to an area covered by one of the first integrated circuit dies 118. Outer sidewalls of the channels 142F may be aligned with sidewalls of the first integrated circuit die 118. A perimeter of the channels 142F may be aligned with a perimeter of the first integrated circuit die 118 and an area covered by the channels 142 may be equal to an area of the first integrated circuit die 118. In some embodiments, the channels 142 formed in the lid 140 may be aligned with any of the first integrated circuit dies 118 or the second integrated circuit dies 120.

In FIG. 9L, the channels 142G may cover a rectangular area of the lid 140 over portions of the first integrated circuit dies 118. In some embodiments, the channels 142G may be formed over hot spot areas of the first integrated circuit dies 118. In some embodiments, some sidewalls of the channels 142G may be aligned with sidewalls of the first integrated circuit dies 118 and other sidewalls of the channels 142G may be within perimeters of the first integrated circuit dies 118. The channels 142G may be formed over portions of any of the first integrated circuit dies 118 or the second integrated circuit dies 120.

The channels 142 according to any of the embodiments illustrated and described with respect to FIGS. 9A through 9L may be used to provide cooling to the semiconductor devices 100. As will be discussed below, a cooling cover (such as the cooling cover 168, discussed below with respect to FIGS. 13A and 13B) may subsequently be attached to the lid 140 and may provide a coolant, such as a liquid coolant to the channels 142. Providing the channels 142 improves the cooling capability of the lid 140, which allows for materials such as silicon and the like to be used for the lid 140 instead of materials such as copper and reduces costs. In some embodiments, the lid 140 including the channels 142 may have a cooling capability of greater than about 4 W/mm$^2$ and may have a thermal insulance of less than about 22 mm$^2$·K/W. Materials of the lid 140 may be compatible with semiconductor processing apparatuses and may easily be integrated into the semiconductor device manufacturing process.

Figure 10:
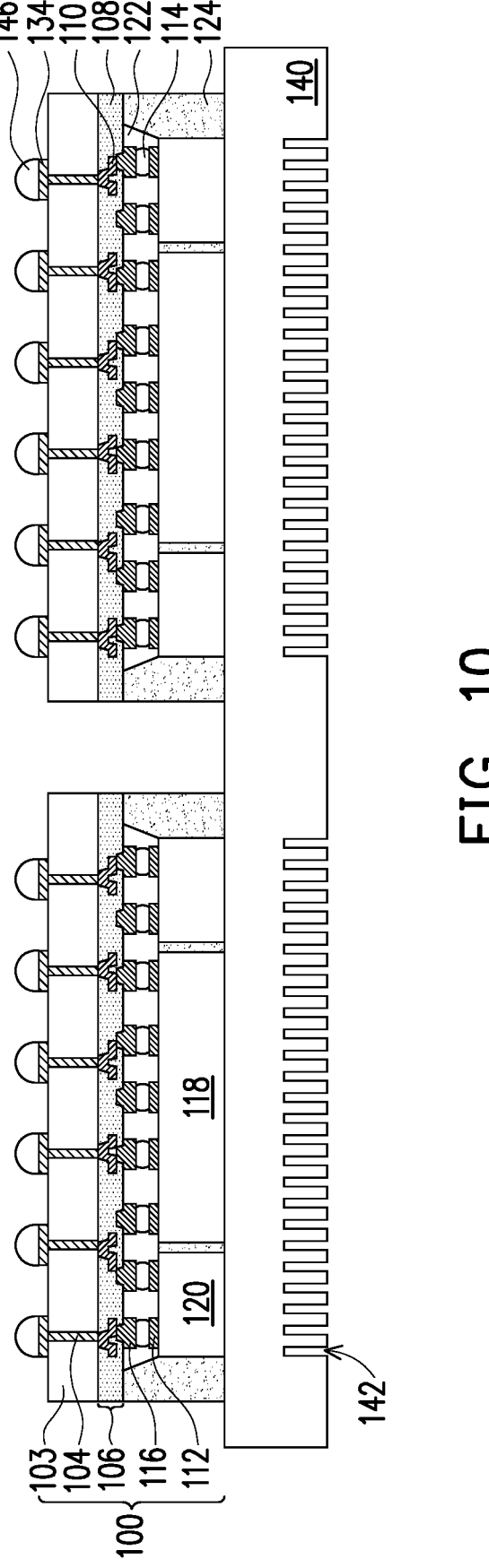

In FIG. 10, conductive connectors 146 are formed on the die connectors 134. The conductive connectors 146 may be ball grid array (BGA) connectors, solder balls, metal pillars, controlled collapse chip connection (C4) bumps, micro bumps, electroless nickel-electroless palladium-immersion gold technique (ENEPIG)-formed bumps, or the like. The conductive connectors 146 may include a conductive material such as solder, copper, aluminum, gold, nickel, silver, palladium, tin, the like, or a combination thereof. In some embodiments, the conductive connectors 146 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 146 comprise metal pillars (such as copper pillars) formed by sputtering, printing, electroplating, electroless plating, CVD, or the like. In embodiments in which the conductive connectors comprise metal pillars, the metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 11:
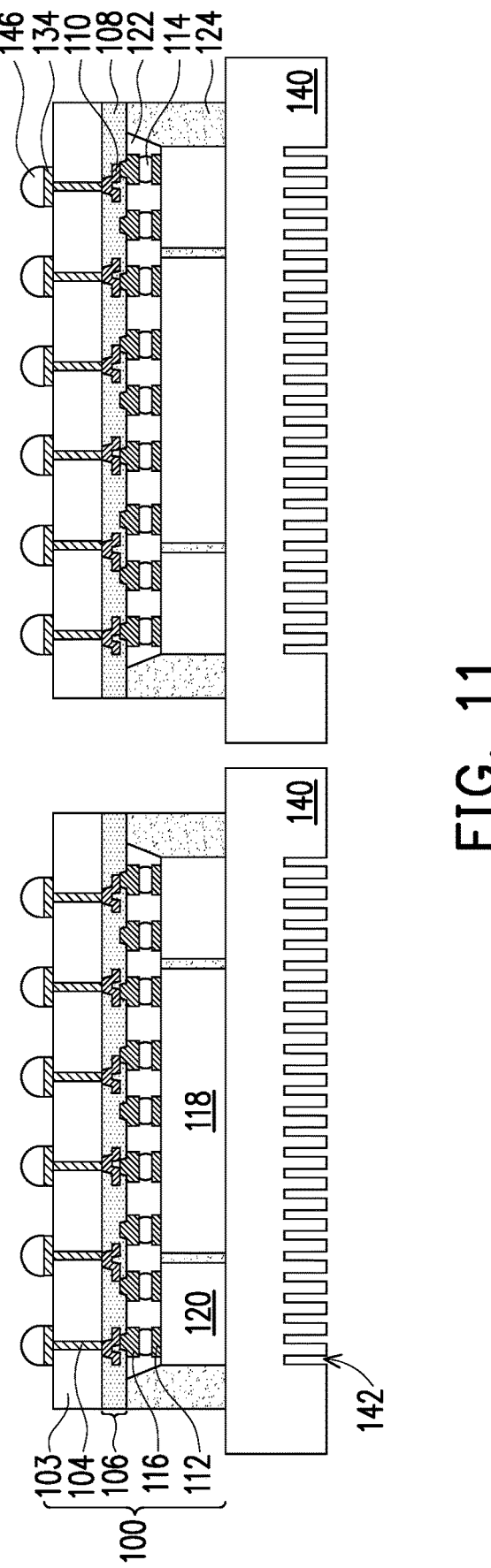

In FIG. 11, a singulation process is performed on the lid 140 by sawing along scribe line regions, for example, between the semiconductor devices 100. The sawing singulates portions of the lid 140 to which individual semiconductor devices 100 are bonded from one another.

Figure 12:
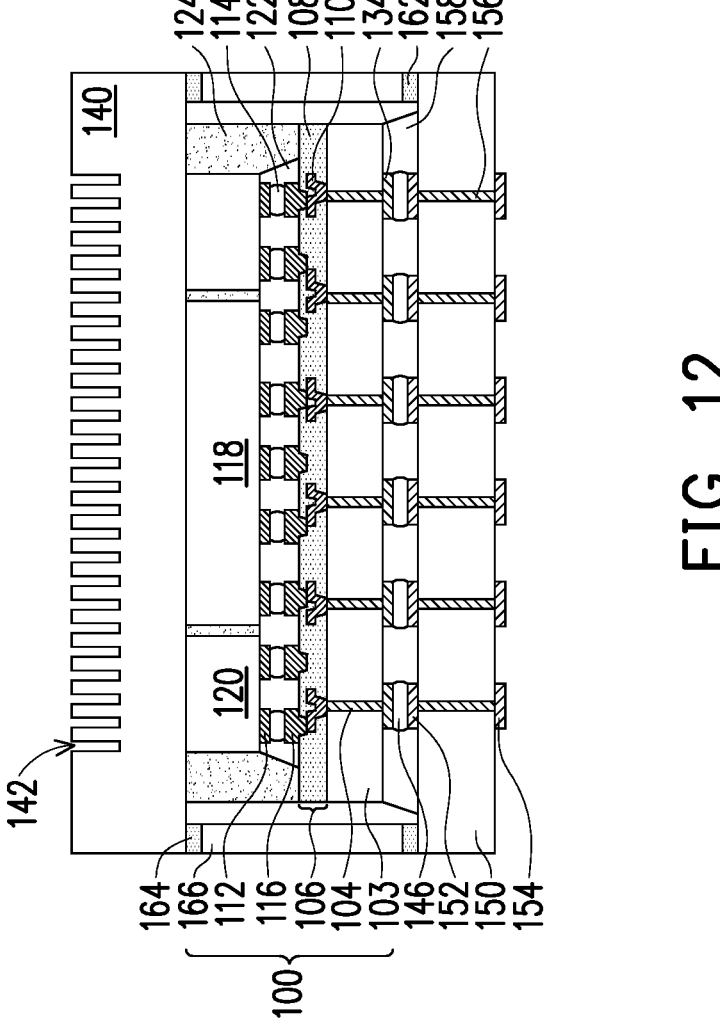

In FIG. 12, a substrate 150 is coupled to each of the semiconductor devices 100 and each of the portions of the lid 140. The substrate 150 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 150 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. In some embodiments, the substrate 150 may be based on an insulating core such as a fiberglass reinforced resin core. In some embodiments, the core material may be a fiberglass resin such as FR4. In some embodiments, the core material may include bismaleimide-triazine (BT) resin, other printed circuit board (PCB) materials, or other films. Build up films such as Ajinomoto build-up film (ABF) or other laminates may be used for the substrate 150.

The substrate 150 may include active and passive devices (not separately illustrated). A wide variety of devices such as transistors, capacitors, resistors, combinations of these, and the like may be included. The devices may be formed using any suitable methods. The substrate 150 may also include metallization layers (not shown) and conductive vias 156. The metallization layers may be formed over the active and passive devices and are designed to connect the various devices to form functional circuitry. The metallization layers may be formed of alternating layers of dielectric materials (e.g., low-k dielectric materials) and conductive materials (e.g., copper) with vias interconnecting the layers of conductive materials. The metallization layers may be formed through any suitable processes (such as deposition, damascene, dual damascene, or the like). In some embodiments, the substrate 150 is substantially free of active and passive devices.

The substrate 150 may include bond pads 152 formed on a first side of the substrate 150 and bond pads 154 on a second side of the substrate 150 opposite the first side of the substrate 150. The bond pads 152 may be coupled to the conductive connectors 146. In some embodiments, the bond pads 152 and the bond pads 154 may be formed by forming recesses (not separately illustrated) into dielectric layers (not separately illustrated) on the first and second sides of the substrate 150. The recesses may be formed to allow the bond pads 152 and the bond pads 154 to be embedded into the dielectric layers. In some embodiments, the recesses are omitted and the bond pads 152 and the bond pads 154 may be formed on the dielectric layers. In some embodiments, the bond pads 152 and the bond pads 154 include a thin seed layer (not separately illustrated) made of copper, titanium, nickel, gold, palladium, the like, or a combination thereof. The conductive materials of the bond pads 152 and the bond pads 154 may be deposited over the thin seed layer. The conductive materials may be formed by an electro-chemical plating process, an electroless plating process, CVD, atomic layer deposition (ALD), PVD, the like, or a combination thereof. In an embodiment, the conductive materials of the bond pads 152 and the bond pads 154 include copper, tungsten, aluminum, silver, gold, the like, or a combination thereof.

In some embodiments, the bond pads 152 and the bond pads 154 are UBMs that include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 152 and the bond pads 154. Any suitable materials or layers of materials that may be used for the bond pads 152 and the bond pads 154 are fully intended to be included within the scope of the current application. In some embodiments, the conductive vias 156 extend through the substrate 150 and couple at least one of the bond pads 152 to at least one of the bond pads 154.

The substrate 150 may be mechanically and electrically bonded to the semiconductor device 100 by way of the bond pads 152, the conductive connectors 146, and the die connectors 134. The substrate 150 may be placed over the semiconductor device 100 and a reflow process may be performed to reflow the conductive connectors 146 and bond the bond pads 152 to the die connectors 134 through the conductive connectors 146.

An underfill 158 may then be formed between the semiconductor device 100 and the substrate 150, surrounding the bond pads 152, the die connectors 134, and the conductive connectors 146. The underfill 158 may reduce stress and protect the joints resulting from the reflowing of the conductive connectors 146. The underfill 158 may be formed by a capillary flow process after the substrate 150 is attached to the semiconductor device 100, or may be formed by a suitable deposition method before the substrate 150 is attached.

Further in FIG. 12, a ring structure 166 may be attached to the lid 140 and the substrate 150. The ring structure 166 may be attached first to either the lid 140 or the substrate 150 and then attached to the other of the lid 140 or the substrate 150. The ring structure 166 may be attached to protect the semiconductor device 100, to add stability to the substrate 150, and/or to dissipate heat from the semiconductor device 100 and the substrate 150. The ring structure 166 may be formed from a material having a high thermal conductivity, such as steel, stainless steel, copper, aluminum, combinations thereof, or the like. In some embodiments, the ring structure 166 may be a metal coated with another metal, such as gold.

An adhesive 164 may be used to attach the ring structure 166 to the lid 140 and an adhesive 162 may be used to attach the ring structure 166 to the substrate 150. The adhesive 164 and the adhesive 162 may be thermal interface materials (TIMs) or other adhesives. The TIMs may be adhesive materials having good thermal conductivities. The adhesives may be any suitable adhesives, epoxies, die attach films (DAFs), or the like. In some embodiments, the adhesive 164 may be a TIM and the adhesive 162 may be an adhesive having a relatively lower thermal conductivity. The ring structure 166 may encircle the semiconductor device 100. As illustrated in FIG. 12, side surfaces of the lid 140, the adhesive 164, the ring structure 166, the adhesive 162, and the substrate 150 may be aligned with one another.

Figure 13A:
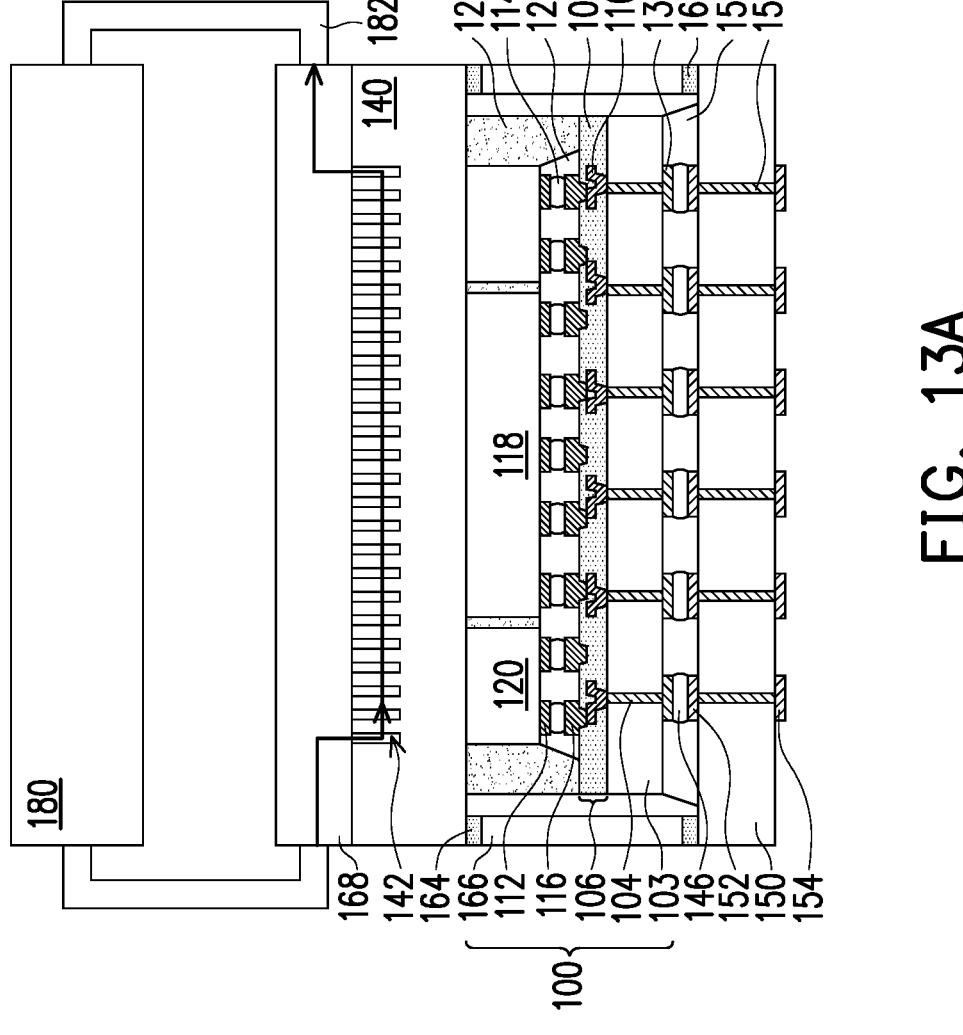
Figure 13B:
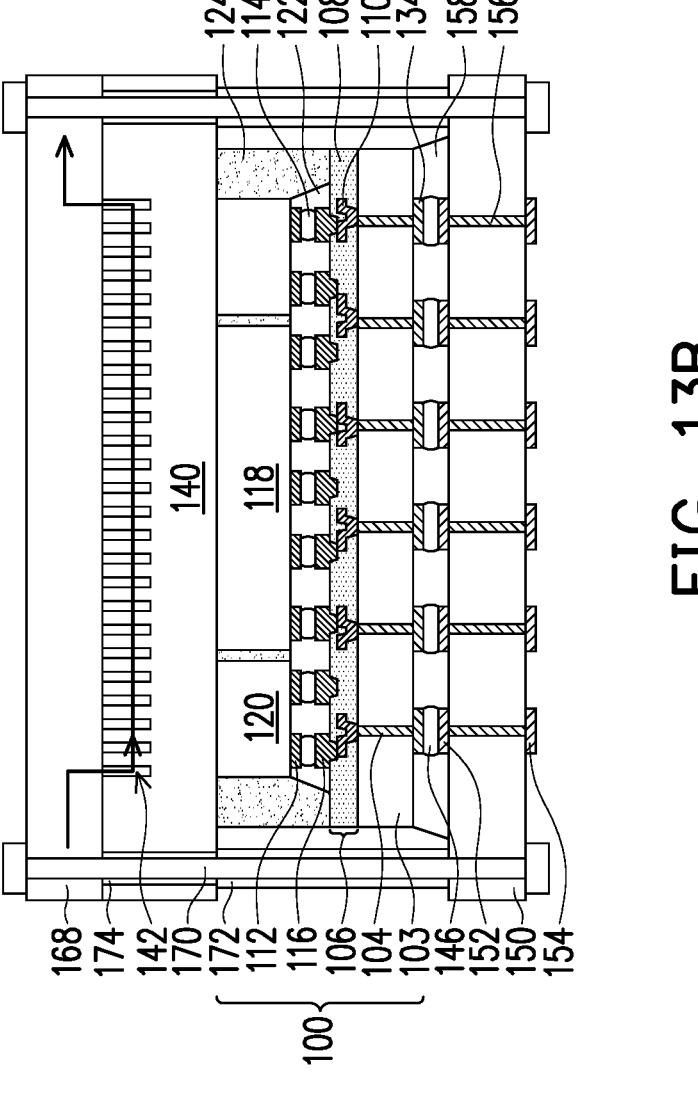

In FIGS. 13A and 13B, a cooling cover 168 is attached to the lid 140. In some embodiments, such as the embodiment illustrated in FIG. 13A the cooling cover 168 may be attached to the lid 140 using an adhesive, which may be the same as or similar to the adhesive 164 and the adhesive 162. In further embodiments, such as the embodiment illustrated in FIG. 13B, the cooling cover 168 may be attached to the lid 140 using screw-type fasteners 170. In embodiments in which the cooling cover 168 is attached to the lid 140 using the screw-type fasteners 170, first spacers 172 may be disposed between the substrate 150 and the lid 140 and second spacers 174 may be disposed between the lid 140 and the screw-type fasteners 170. The first spacers 172 and the second spacers 174 may be used to provide proper alignment and spacing of the cooling cover 168, the lid 140, and the substrate 150. The screw-type fasteners 170 may pass through holes formed through the cooling cover 168, the lid 140, and the substrate 150. In some embodiments, O-rings or other gaskets may be interposed between the screw-type fasteners 170, the first spacers 172, and the second spacers 174 and any of the cooling cover 168, the lid 140, and the substrate 150 to seal the space including the substrate 103, the first integrated circuit die 118, and the second integrated circuit dies 120.

Figure 21:
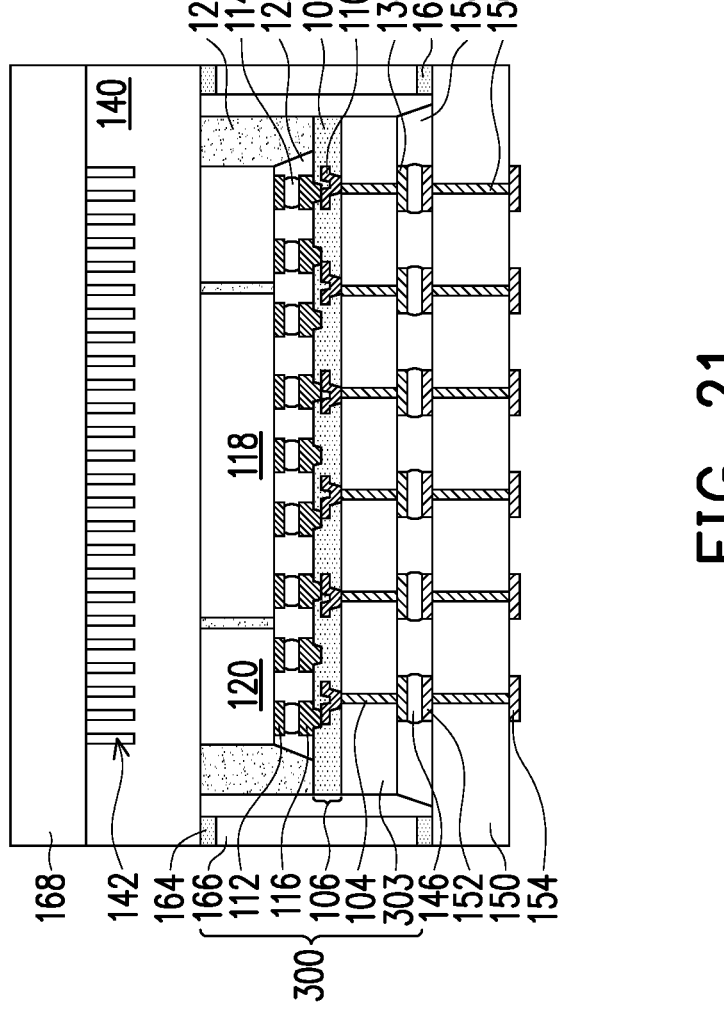

The cooling cover 168 may be configured to provide a coolant, such as a liquid coolant, to the channels 142 of the lid 140. As such, the cooling cover may be in fluid communication with the channels 142 of the lid 140. In some embodiments, the coolant may comprise water, a dielectric coolant, a propylene glycol-based coolant, a phase change material, another conventional coolant, or the like. In embodiments in which the channels 142 are parallel to one another, the coolant may flow through the channels 142 in a direction perpendicular to longitudinal axes of the channels 142, as indicated by the arrows in FIGS. 13A and 13B. In some embodiments, the coolant may flow through the channels 142 in a direction parallel to longitudinal axes of the channels 142. The cooling cover 168 may have a width equal to a width of the substrate 150 and, as illustrated in FIG. 21, side surfaces of the cooling cover 168, the lid 140, the adhesive 164, the ring structure 166, the adhesive 162, and the substrate 150 may be aligned with one another.

The coolant may be provided to the cooling cover 168 by a heat transfer unit 180, which may include a chiller, a pump, a combination thereof, or the like. The heat transfer unit 180 may be connected to the cooling cover 168 by a pipe fitting 182, which may be connected to the cooling cover 168 through glue or another adhesive, a screw-type fitting, a quick connection, or the like. A single heat transfer unit 180 may be attached to one or more of the cooling covers 168. The heat transfer unit 180 may supply the coolant to the cooling cover 168 at a flowrate ranging from about 0.01 to about 1,000 liters per minute. In some embodiments, the heat transfer unit 180 may comprise a pump which pumps facility water to the cooling cover 168. In some embodiments, the heat transfer unit 180 and the cooling cover 168 may only supply coolant to the channels 142 during operation and the coolant may fill the channels 142 of the lid 140 during operation.

Providing the channels 142 and flowing a coolant through the channels 142 improves the cooling capability of the lid 140. This may allow for materials such as silicon and the like to replace materials such as copper in the lid 140, which reduces costs. The channels 142 may be formed by low-cost methods, such as wet etching, die sawing, laser cutting, or the like. Materials of the lid 140 may be compatible with semiconductor processing apparatuses and may easily be integrated into semiconductor device manufacturing processes.

Figure 14A:
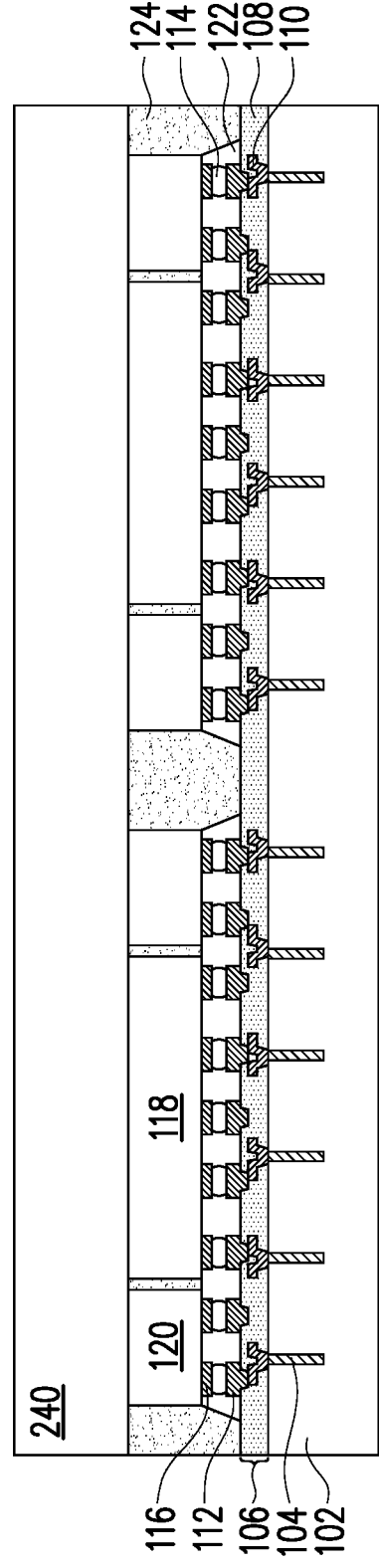

FIGS. 14A through 17B illustrate an embodiment in which a lid 240 is bonded to a wafer 102 before singulating the wafer 102. The steps performed in and discussed with respect to FIGS. 1 through 4 may be performed prior to the steps illustrated in FIGS. 14A through 14C. In FIGS. 14A through 14C, a lid 240 is bonded to the encapsulant 124, the first integrated circuit dies 118, and the second integrated circuit dies 120. In some embodiments, the lid 240 may comprise materials such as silicon, glass, a metal, a polymer, or the like. The lid 240 may have a thickness ranging from about 10 μm to about 10,000 μm.

In the embodiment illustrated in FIG. 14A, the lid 240 may be bonded to the encapsulant 124, the first integrated circuit dies 118, and the second integrated circuit dies 120 through fusion bonding or the like. Specifically, the lid 240 may be bonded to the encapsulant 124, the first integrated circuit dies 118, and the second integrated circuit dies 120 through dielectric-to-dielectric bonding, without using any adhesive material (e.g., die attach film). The bonding may include a pre-bonding and an annealing. During the pre-bonding, a small pressing force is applied to press the lid 240 against the encapsulant 124, the first integrated circuit dies 118, and the second integrated circuit dies 120. The pre-bonding is performed at a low temperature, such as room temperature (e.g., a temperature in the range of about 15° C. to about 30° C.). In some embodiments, oxides, such as native oxides, are formed at a bottom surface of the lid 240 and top surfaces of the encapsulant 124, the first integrated circuit dies 118, and the second integrated circuit dies 120 and are used for the bonding. The bonding strength is then improved in a subsequent annealing step, in which the lid 240 and the encapsulant 124, the first integrated circuit dies 118, and the second integrated circuit dies 120 are annealed at a high temperature, such as a temperature in the range of about 100° C. to about 400° C. After the annealing, bonds, such as fusion bonds, are formed bonding the lid 240 to the encapsulant 124, the first integrated circuit dies 118, and the second integrated circuit dies 120. For example, the bonds can be covalent bonds between the lid 240 and the encapsulant 124, the first integrated circuit dies 118, and the second integrated circuit dies 120. Although FIG. 14A illustrates the encapsulant 124, the first integrated circuit dies 118, and the second integrated circuit dies 120 as having coplanar surfaces, in some embodiments, surfaces of any of the encapsulant 124, the first integrated circuit dies 118, or the second integrated circuit dies 120 may be recessed. In said embodiments, the lid 240 may be bonded to whichever surfaces of the encapsulant 124, the first integrated circuit dies 118, and/or the second integrated circuit dies 120 are disposed furthest from the wafer 102.

Figure 14B:
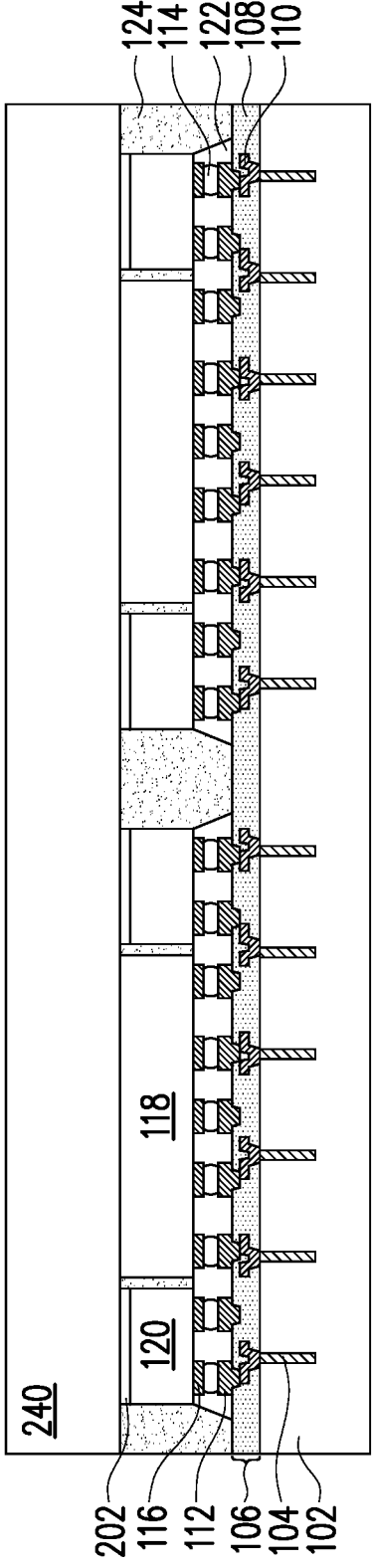

In FIG. 14B, top surfaces of the second integrated circuit dies 120 are recessed below top surfaces of the encapsulant 124 and the first integrated circuit dies 118 and the lid 240 is bonded to the encapsulant 124, the first integrated circuit dies 118, and the second integrated circuit dies 120 through a combination of fusion bonding and an adhesive 202. The adhesive 202 may be the same as or similar to the adhesive 164 and the adhesive 162, described above with respect to FIG. 12. Surfaces of the encapsulant 124 and the first integrated circuit dies 118 may be bonded to the lid 240 through fusion bonding, as described above with respect to the embodiment illustrated in FIG. 14B. FIG. 14B illustrates the adhesive 202 as being applied to surfaces of the second integrated circuit dies 120 to bond the lid 240 to the second integrated circuit dies 120. However, the adhesive 202 may be applied to any of the encapsulant 124, the first integrated circuit dies 118, and/or the second integrated circuit dies 120 to bond the encapsulant 124, the first integrated circuit dies 118, and/or the second integrated circuit dies 120 to the lid 240 and fusion bonding may be used to bond the lid 240 to the remainder of the encapsulant 124, the first integrated circuit dies 118, and/or the second integrated circuit dies 120.

Figure 14C:
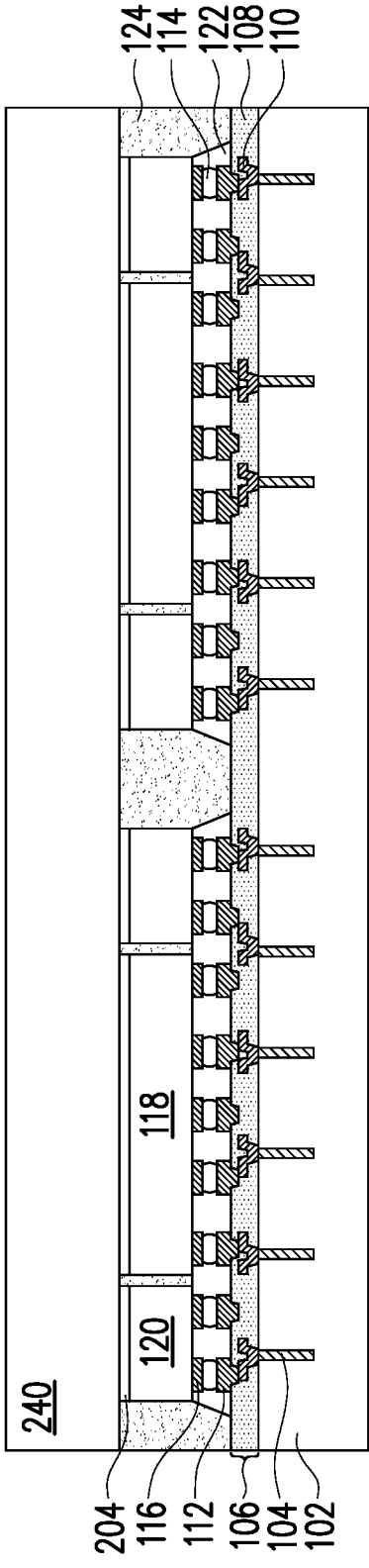

In FIG. 14C, glass frit bonding may be used to bond the lid 240 to the encapsulant 124, the first integrated circuit dies 118, and the second integrated circuit dies 120. Top surfaces of any of the encapsulant 124, the first integrated circuit dies 118, and/or the second integrated circuit dies 120 may be recessed. In the embodiment illustrated in FIG. 14C, top surfaces of the first integrated circuit dies 118 and the second integrated circuit dies 120 are recessed. A glass material 204, such as a glass paste, a glass solder or the like, may be applied to any of the encapsulant 124, the first integrated circuit dies 118, and/or the second integrated circuit dies 120, such as the first integrated circuit dies 118 and the second integrated circuit dies 120. The glass material 204 may be deposited by screen printing, spin coating, or the like. The lid 240 may be aligned with the encapsulant 124, the first integrated circuit dies 118, and the second integrated circuit dies 120 and the glass material 204 may be heated to reflow the glass material and bond the lid to the encapsulant 124, the first integrated circuit dies 118, and the second integrated circuit dies 120. In some embodiments, a combination of glass frit bonding and fusion bonding may be used to bond the lid 240 to the encapsulant 124, the first integrated circuit dies 118, and the second integrated circuit dies 120. Bonding the lid 240 to the encapsulant 124, the first integrated circuit dies 118, and the second integrated circuit dies 120 through glass frit bonding may help to provide a planar surface over the encapsulant 124, the first integrated circuit dies 118, and the second integrated circuit dies 120.

Figure 15:
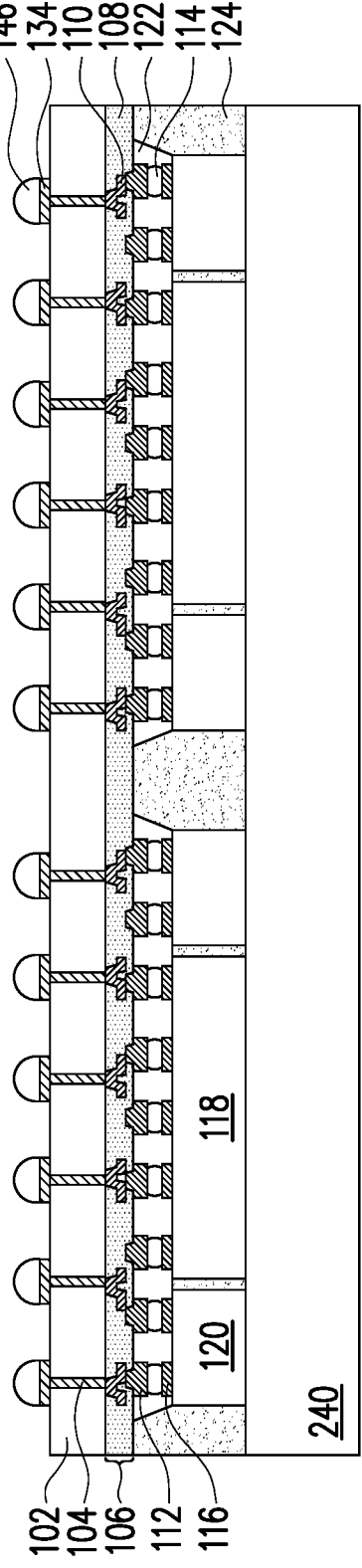

In FIG. 15, the structure of FIG. 14 is flipped and die connectors 134 and conductive connectors 146 are formed over the backside of the wafer 102. The die connectors may be in physical contact with and electrically coupled to the conductive vias 104. The die connectors 134 may be conductive pillars, pads, or the like, to which external connections are made. The die connectors 134 can be formed of a metal, such as copper, aluminum, or the like, and can be formed by, for example, plating, or the like. The die connectors 134 are electrically connected to devices formed in the wafer 102 and the interconnect structure 106.

The conductive connectors 146 may be ball grid array (BGA) connectors, solder balls, metal pillars, controlled collapse chip connection (C4) bumps, micro bumps, electroless nickel-electroless palladium-immersion gold technique (ENEPIG)-formed bumps, or the like. The conductive connectors 146 may include a conductive material such as solder, copper, aluminum, gold, nickel, silver, palladium, tin, the like, or a combination thereof. In some embodiments, the conductive connectors 146 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 146 comprise metal pillars (such as copper pillars) formed by sputtering, printing, electroplating, electroless plating, CVD, or the like. In embodiments in which the conductive connectors comprise metal pillars, the metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 16:
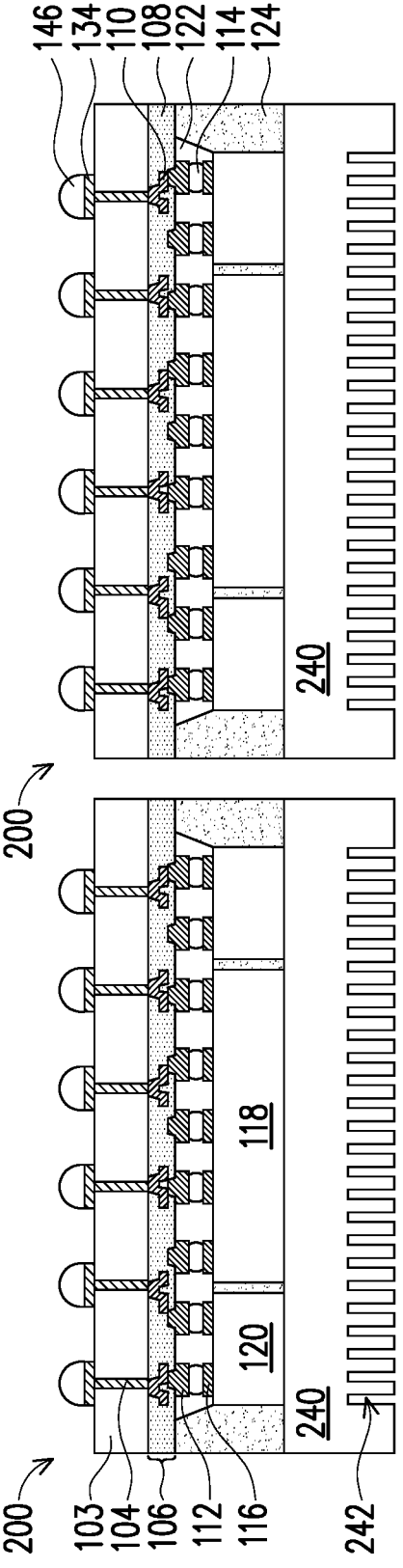

In FIG. 16, a singulation process is performed by sawing along scribe line regions, forming semiconductor devices 200. The sawing singulates individual semiconductor devices 200 from one another. The lid 240, the encapsulant 124, the interconnect structure 106, and the wafer 102 may be sawed during the singulation process. The singulation process singulates the wafer 102 to form substrates 103. Each of the semiconductor devices 200 may include one first integrated circuit die 118 and four second integrated circuit dies 120; however, any number of first integrated circuit dies 118 and second integrated circuit dies 120 may be included in each of the semiconductor devices 200. As illustrated in FIG. 16, side surfaces of the lid 240, the encapsulant 124, the interconnect structure 106, and the substrate 103 may be aligned with one another.

Further in FIG. 16, channels 242 may be formed in the lid 240. The channels 242 may be formed in the lid 240 before or after performing the singulation process. The channels 242 may be the same as or similar to the channels 142 and may be formed by any of the processes discussed above with respect to FIGS. 9A through 9L. Further, the channels 242 may cover any of the areas discussed above with respect to FIGS. 9A through 9L (e.g., the channels 242 may cover an area equal to a combined area of the first integrated circuit dies 118, the second integrated circuit dies 120, and an area of intervening portions of the encapsulant 124; an area equal to an area of the first integrated circuit dies 118; an area less than an area of the first integrated circuit dies 118; or the like).

Figure 17A:
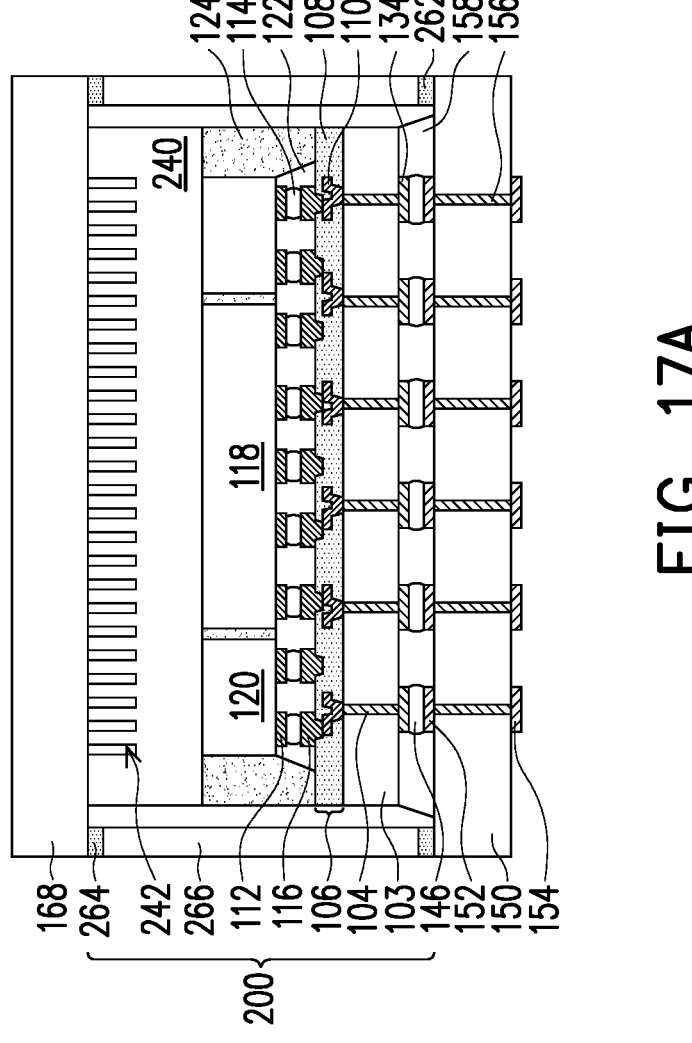
Figure 17B:
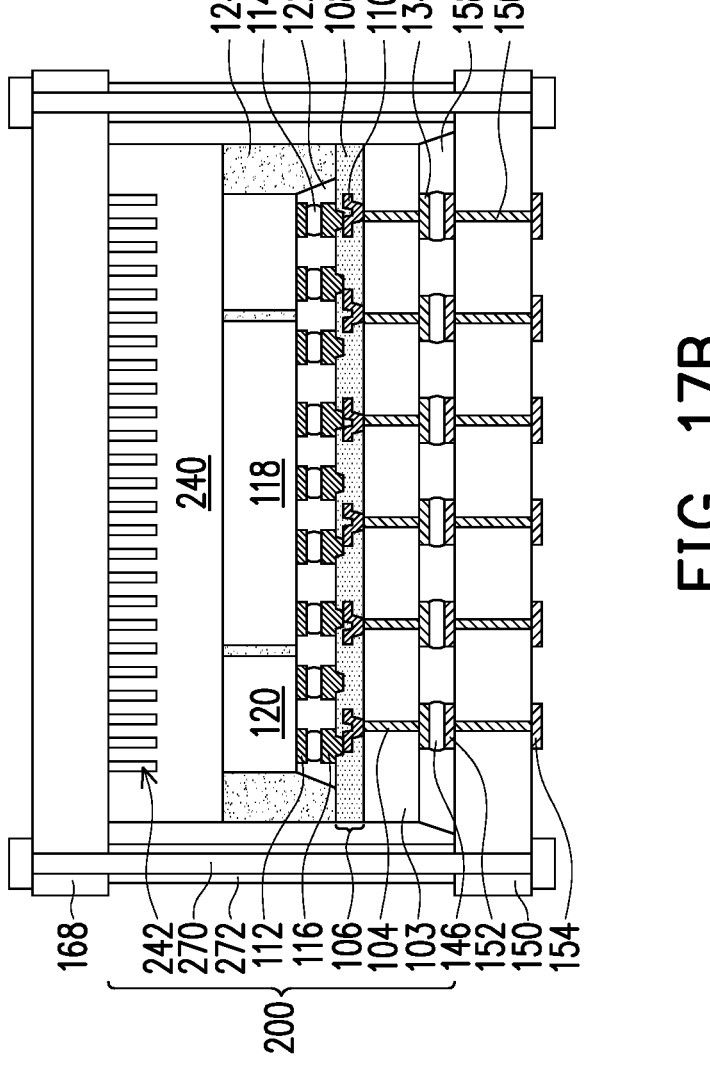

In FIGS. 17A and 17B, a substrate 150 is coupled to the substrate 103 and a cooling cover 168 is coupled to the lid 240. The substrate 150 may be the same as or similar to the substrate 150 described above with respect to FIG. 12. Bond pads 152 of the substrate 150 may be bonded to the die connectors 134 of the substrate 103 through reflowing the conductive connectors 146 and an underfill 158 may surround the conductive connectors 146, the die connectors 134, and the bond pads 152. The bond pads 152 and the underfill 158 may be the same as or similar to the bond pads 152 and the underfill 158 described above with respect to FIG. 12.

A cooling cover 168 may be attached to the lid 240. The cooling cover 168 may be the same as or similar to the cooling cover 168 discussed above with respect to FIGS. 13A and 13B. In some embodiments, such as the embodiment illustrated in FIG. 17B, the cooling cover 168 may be attached to the lid 240 using screw-type fasteners 270. In embodiments in which the cooling cover 168 is attached to the lid 240 using the screw-type fasteners 270, first spacers 272 may be disposed between the substrate 150 and the cooling cover 168. The first spacers 272 may be used to provide proper alignment and spacing of the cooling cover 168 and the substrate 150. The screw-type fasteners 270 may pass through holes formed through the cooling cover 168 and the substrate 150. In some embodiments, O-rings or other gaskets may be interposed between the screw-type fasteners 270 and the first spacers 272 and either of the cooling cover 168 or the substrate 150 to seal the space including the substrate 103, the first integrated circuit die 118, the second integrated circuit dies 120, and the lid 240.

As discussed above, the cooling cover 168 may supply a coolant, such as a liquid coolant, to the channels 242 of the lid 240. Providing the channels 242 and flowing a coolant through the channels 242 improves the cooling capability of the lid 240. This may allow for materials such as silicon and the like to replace materials such as copper in the lid 240, which reduces costs. The channels 242 may be formed by low-cost methods, such as wet etching, die sawing, laser cutting, or the like. Materials of the lid 240 may be compatible with semiconductor processing apparatuses and may easily be integrated into semiconductor device manufacturing processes.

A ring structure 266 may be attached to the cooling cover 168 and the substrate 150. An adhesive 264 may be used to attach the ring structure 266 to the cooling cover 168 and an adhesive 262 may be used to attach the ring structure 266 to the substrate 150. The ring structure 266, the adhesive 264, and the adhesive 262 may be the same as or similar to the ring structure 166, the adhesive 164, and the adhesive 162 described above with respect to FIG. 12, except that the ring structure 266 may have a height greater than a height of the ring structure 166. As such, the ring structure 266 may encircle the semiconductor device 200, including the lid 240, the encapsulant 124, the interconnect structure 106, and the substrate 103. The adhesive 264 and the adhesive 262 may be thermal interface materials (TIMs) or other adhesives.

Figure 18:
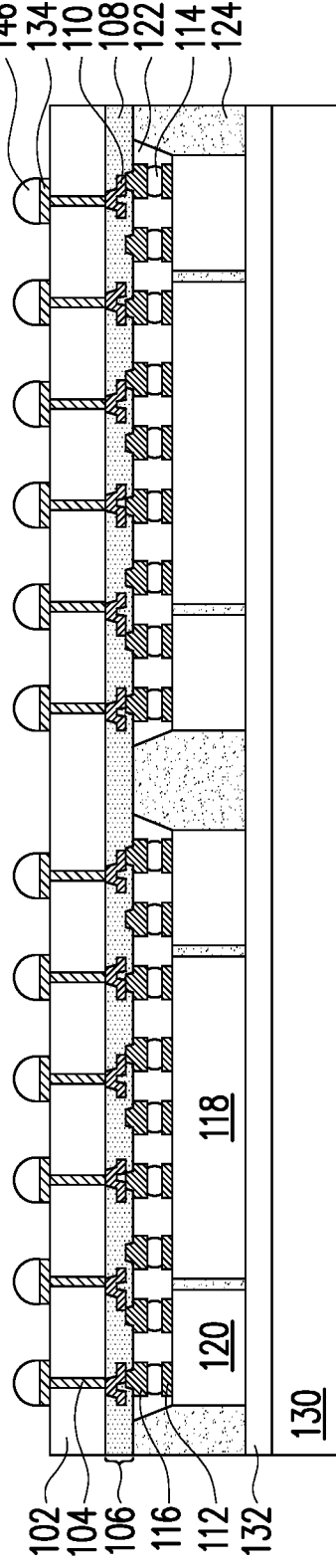

FIGS. 18 through 21 illustrate an embodiment in which conductive connectors 146 are formed over the wafer 102 and the wafer 102 is subsequently singulated to form semiconductor devices 300. The steps performed in and discussed with respect to FIGS. 1 through 7 may be performed prior to the steps illustrated in FIG. 18. In FIG. 18, conductive connectors 146 are formed on the die connectors 134. The conductive connectors 146 may be the same as or similar to the conductive connectors 146 discussed above with respect to FIG. 10.

Figure 19:
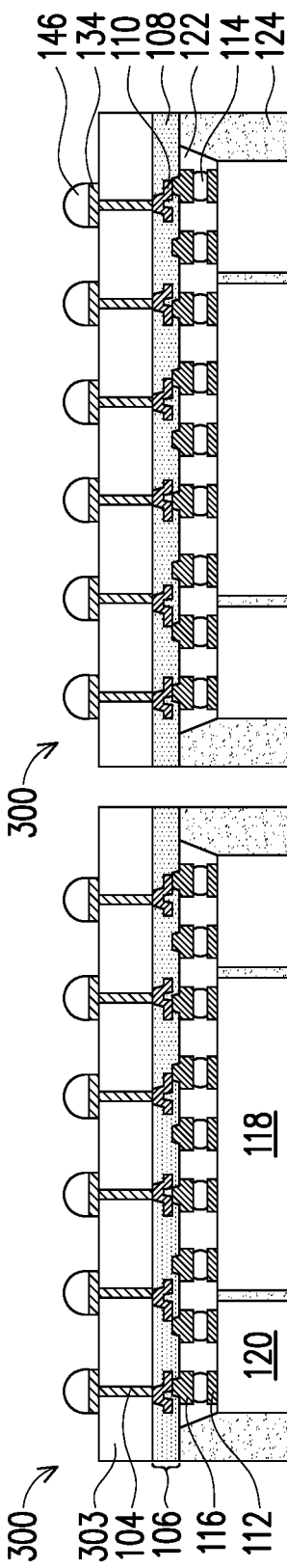

In FIG. 19, a singulation process is performed by sawing along scribe line regions, for example, between device regions of the wafer 102. The sawing singulates individual semiconductor devices 300 from one another. The resulting, singulated semiconductor devices 300 may be from any of the device regions. The singulation process singulates the wafer 102 to form substrates 303. The singulation process may also saw through the encapsulant 124 and the interconnect structure 106.

Further in FIG. 19, a carrier substrate de-bonding is performed to detach (or "de-bond") the carrier substrate 130 from the encapsulant 124, the first integrated circuit dies 118, and the second integrated circuit dies 120. In some embodiments, the de-bonding includes projecting a light, such as a laser light or an UV light, on the release layer 132 so that the release layer 132 decomposes under the heat of the light and the carrier substrate 130 can be removed. The carrier substrate de-bonding may be performed before or after the singulation process is performed.

Figure 20:
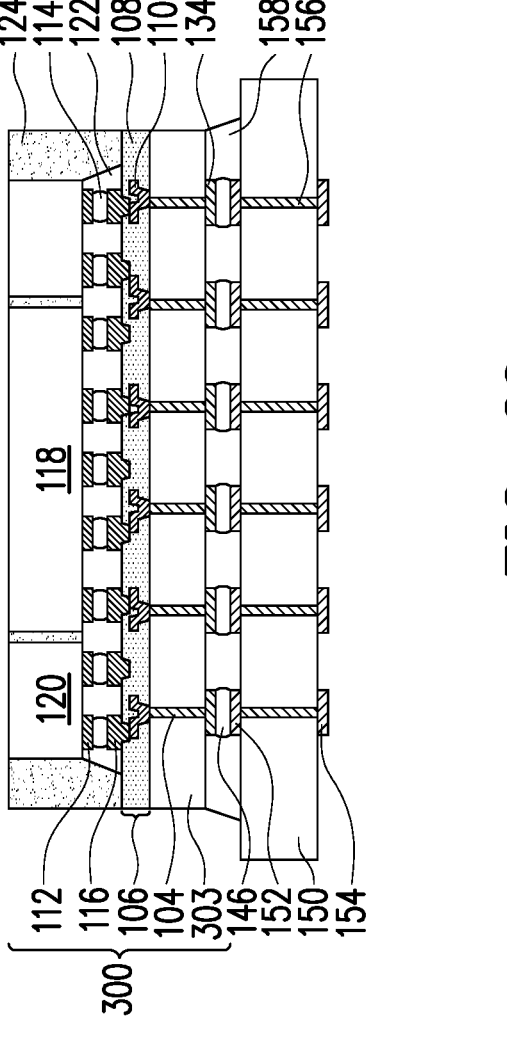

In FIG. 20, a substrate 150 is coupled to the substrate 303. The substrate 150 may be the same as or similar to the substrate 150 described above with respect to FIG. 12. Bond pads 152 of the substrate 150 may be bonded to the die connectors 134 of the substrate 303 through reflowing the conductive connectors 146 and an underfill 158 may surround the conductive connectors 146, the die connectors 134, and the bond pads 152. The bond pads 152 and the underfill 158 may be the same as or similar to the bond pads 152 and the underfill 158 described above with respect to FIG. 12.

In FIG. 21, a lid 140 is coupled to the encapsulant 124, the first integrated circuit dies 118, and the second integrated circuit dies 120 and a cooling cover 168 is coupled to the lid 140. The lid 140 may be the same as or similar to the lid 140 after singulation, as discussed above with respect to FIG. 11. The lid 140 may be attached to the semiconductor device 300 by any of the above-described methods, such as fusion bonding (e.g., dielectric-to-dielectric bonding), glass frit bonding, through an adhesive, through combinations thereof, or the like. As illustrated in FIG. 21, the lid 140 may have a width equal to a width of the substrate 150. The lid 140 may include any of the channels 142 discussed above with respect to FIGS. 9A through 9L and the channels 142 may cover any of the above-described areas of the lid 140.

Further, a ring structure 166 may be attached to the lid 140 and the substrate 150. An adhesive 164 may be used to attach the ring structure 166 to the lid 140 and an adhesive 162 may be used to attach the ring structure 166 to the substrate 150. The ring structure 166, the adhesive 164, and the adhesive 162 may be the same as or similar to the ring structure 166, the adhesive 164, and the adhesive 162 described above with respect to FIG. 12. The ring structure 166 may encircle the semiconductor device 300. The adhesive 164 and the adhesive 162 may be thermal interface materials (TIMs) or other adhesives.

A cooling cover 168 may be attached to the lid 140. The cooling cover 168 may be the same as or similar to the cooling cover 168 discussed above with respect to FIGS. 13A and 13B. The cooling cover 168 may have a width equal to a width of the substrate 150 and, as illustrated in FIG. 21, side surfaces of the cooling cover 168, the lid 140, the adhesive 164, the ring structure 166, the adhesive 162, and the substrate 150 may be aligned with one another. As discussed above, the cooling cover 168 may supply a coolant, such as a liquid coolant, to the channels 142 of the lid 140. Providing the channels 142 and flowing a coolant through the channels 142 improves the cooling capability of the lid 140. This may allow for materials such as silicon and the like to replace materials such as copper in the lid 140, which reduces costs. The channels 142 may be formed by low-cost methods, such as wet etching, die sawing, laser cutting, or the like. Materials of the lid 140 may be compatible with semiconductor processing apparatuses and may easily be integrated into semiconductor device manufacturing processes.

Figure 22A:
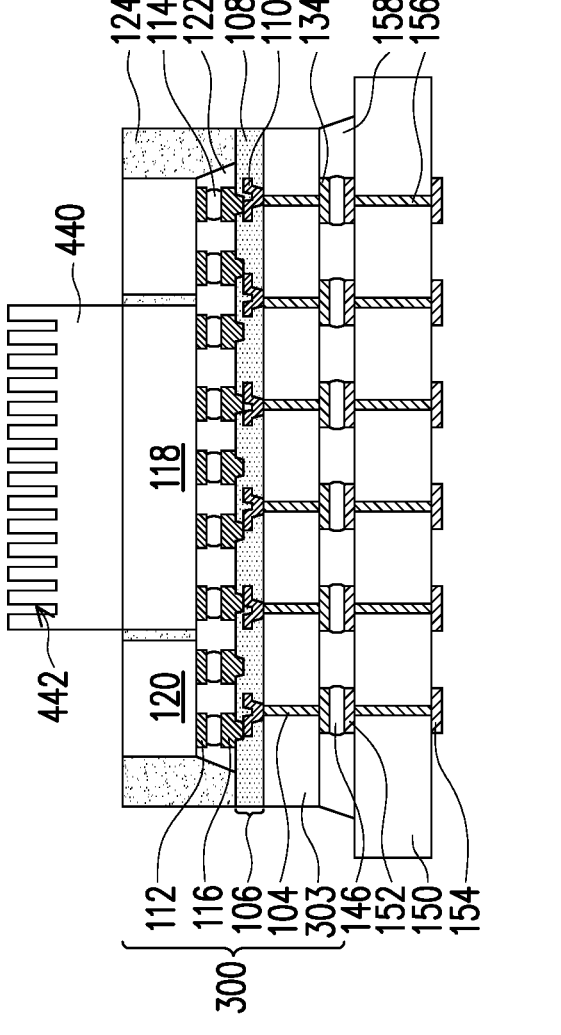
Figure 22B:
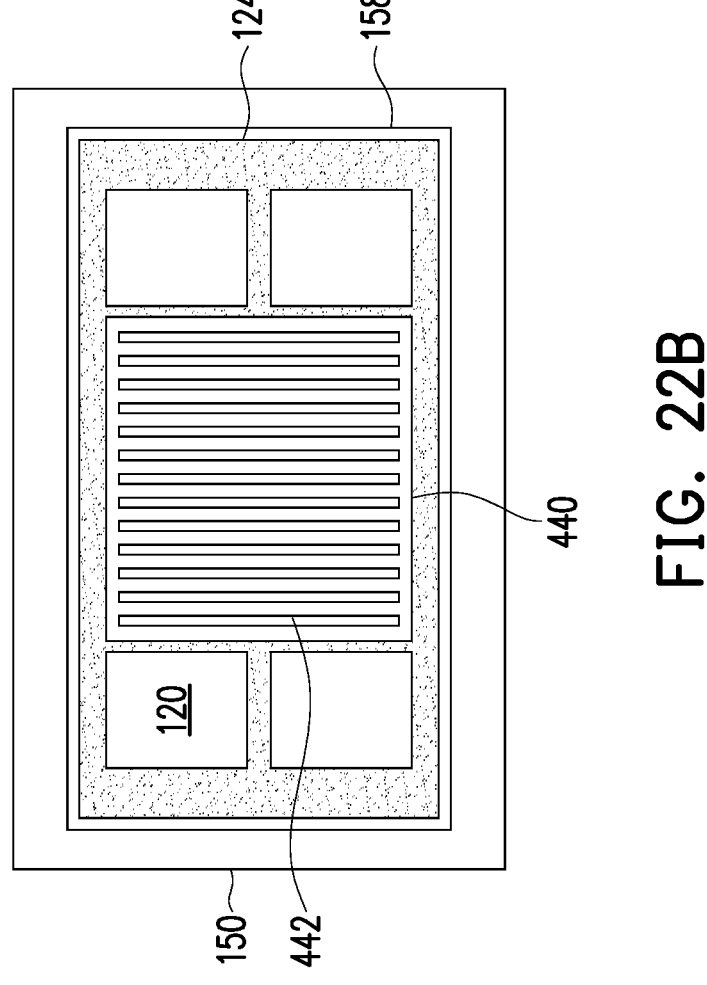
Figure 22C:
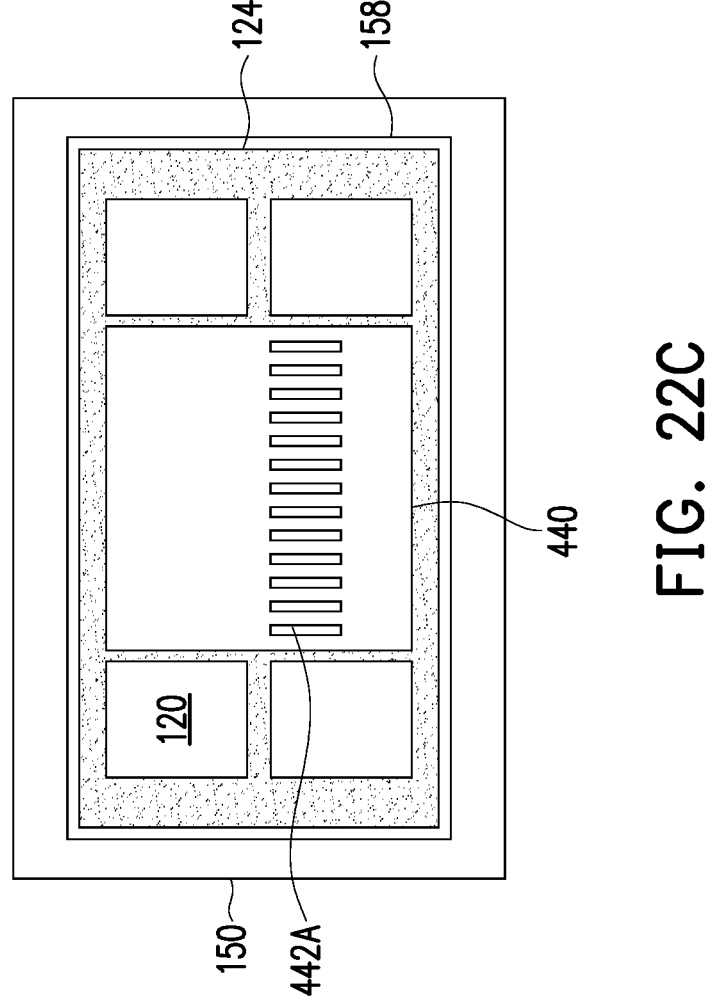
Figure 23:
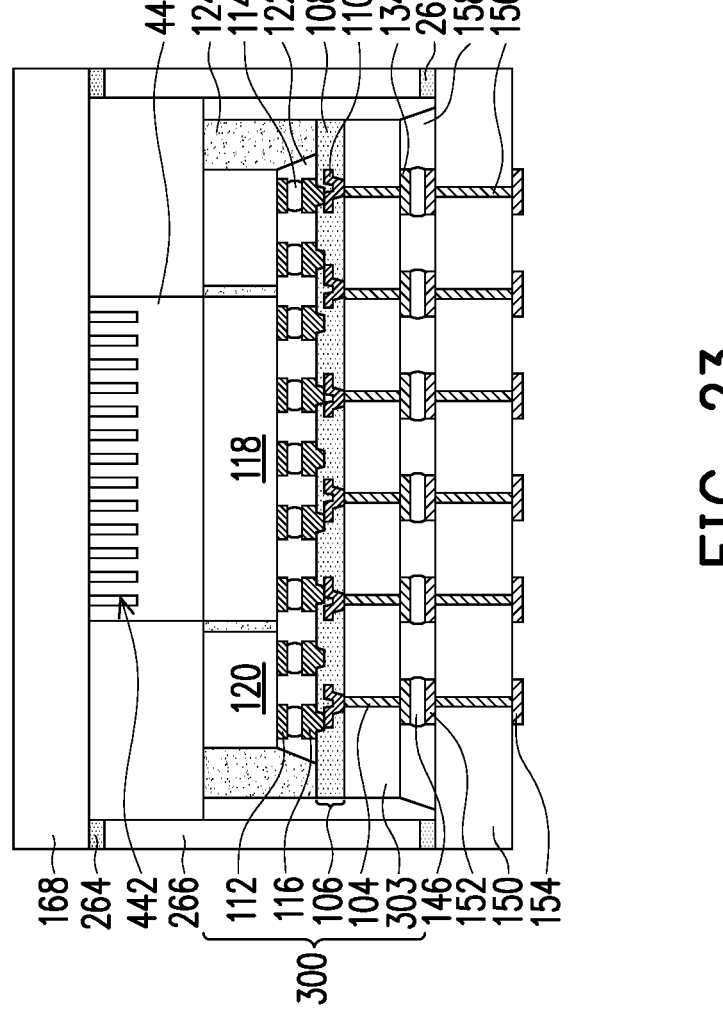

FIGS. 22A through 23 illustrate embodiments in which a lid 440 having a width less than a width of a semiconductor device 300 is coupled to the semiconductor device 300. The steps performed in and discussed with respect to FIGS. 1 through 7 and 18 through 20 may be performed prior to the steps illustrated in FIG. 22A. In FIGS. 22A through 22C, a lid 440 is coupled to the first integrated circuit die 118 of the semiconductor device 300. The lid 440 may be formed of similar materials and by processes similar to those of the lid 140, discussed above with respect to FIGS. 9A through 11, except that the lid 440 has a width less than a width of the semiconductor device 300 and is singulated before being coupled to the semiconductor device 300.

In some embodiments, the lid 440 may comprise materials such as silicon, glass, a metal, a polymer, or the like. The lid 440 may have a thickness ranging from about 10 μm to about 10,000 μm. The lid 440 may be attached to the semiconductor device 300 by any of the above-described methods, such as fusion bonding (e.g., dielectric-to-dielectric bonding), glass frit bonding, through an adhesive, through combinations thereof, or the like. The lid 440 may be formed from a wafer and a singulation process may be performed on the wafer to form individual lids 440. The singulation process may be performed by sawing along scribe line regions or the like. Channels 442 may be formed in the lid 440 before or after the singulation process is performed. As illustrated in FIGS. 22A through 22C, the lid 440 may have a width and area equal to a width and area of the first integrated circuit die 118. However, in other embodiments, the lid 440 may have a width and area equal to widths and areas of any of the first integrated circuit dies 118, the second integrated circuit dies 120, combined areas of the first integrated circuit dies 118, the second integrated circuit dies 120, and areas of intervening portions of the encapsulant 124, or the like.

As illustrated in FIGS. 22A through 22C, the lid 440 may include channels 442/442A formed in a surface of the lid 440 opposite a surface to which the semiconductor devices 300 are bonded. In FIGS. 22A through 22C, each of the channels 442/442A are parallel to one another; however, any of the channel profiles discussed above with respect to FIGS. 9A through 9J may be used for the channels 442/442A. In the embodiment illustrated in FIGS. 22A and 22B, an area of the lid 440 covered by the channels 442 may be the same as an area of the first integrated circuit die 118 of the semiconductor device 300. Outermost sidewalls of the channels 442 may be aligned with or just inside sidewalls of the first integrated circuit die 118. In the embodiment illustrated in FIG. 22C, channels 442A are formed in an area of the lid 440 which is less than an area of the first integrated circuit die 118 of the semiconductor device 300. In some embodiments, the channels 442A may be formed over a hot spot area of the first integrated circuit die 118.

In FIG. 23, a cooling cover 168 is coupled to the lid 440 and a ring structure is attached to the cooling cover 168 and the substrate 150. An adhesive 264 may be used to attach the ring structure 266 to the cooling cover 168 and an adhesive 262 may be used to attach the ring structure 266 to the substrate 150. The ring structure 266, the adhesive 264, and the adhesive 262 may be the same as or similar to the ring structure 166, the adhesive 164, and the adhesive 162 described above with respect to FIG. 12, except that the ring structure 266 may have a height greater than a height of the ring structure 166. As such, the ring structure 266 may encircle the lid 440 and the semiconductor device 300, including the encapsulant 124, the interconnect structure 106, and the substrate 303. The adhesive 264 and the adhesive 262 may be thermal interface materials (TIMs) or other adhesives.

The cooling cover 168 may be attached to the lid 440. The cooling cover 168 may be the same as or similar to the cooling cover 168 discussed above with respect to FIGS. 13A and 13B. The cooling cover 168 may have a width equal to a width of the substrate 150 and, as illustrated in FIG. 21, side surfaces of the cooling cover 168, the adhesive 264, the ring structure 266, the adhesive 262, and the substrate 150 may be aligned with one another. As discussed above, the cooling cover 168 may supply a coolant, such as a liquid coolant, to the channels 442 of the lid 440. Providing the channels 442 and flowing a coolant through the channels 442 improves the cooling capability of the lid 440. This may allow for materials such as silicon and the like to replace materials such as copper in the lid 440, which reduces costs. The channels 442 may be formed by low-cost methods, such as wet etching, die sawing, laser cutting, or the like. Materials of the lid 440 may be compatible with semiconductor processing apparatuses and may easily be integrated into semiconductor device manufacturing processes.

Other features and processes may also be included. For example, testing structures may be included to aid in the verification testing of the 3D packaging or 3DIC devices. The testing structures may include, for example, test pads formed in an interconnect structure or on a substrate that allows the testing of the 3D packaging or the 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments may achieve various advantages. For example, coupling the lids to various semiconductor devices and supplying liquid coolants to channels formed in the lids may provide increased cooling capacities for the semiconductor devices, while being formed by cost-effective processes which are compatible with conventional semiconductor processes apparatuses. The lids may be directly coupled to integrated circuit dies of the semiconductor devices by fusion bonding or the like, which may decrease thermal resistance and further improve cooling capacities for the semiconductor devices. As such, cooling capacities may be increased while decreasing costs.

In accordance with an embodiment, a semiconductor device includes a first integrated circuit die; a lid coupled to the first integrated circuit die, the lid including a plurality of channels in a surface of the lid opposite the first integrated circuit die; a cooling cover coupled to the lid opposite the first integrated circuit die; and a heat transfer unit coupled to the cooling cover through a pipe fitting, the heat transfer unit being configured to supply a liquid coolant to the plurality of channels through the cooling cover. In an embodiment, the lid is coupled to the first integrated circuit die by dielectric-to-dielectric bonds. In an embodiment, the semiconductor device further includes an encapsulant laterally surrounding the first integrated circuit die, the lid being coupled to the encapsulant by dielectric-to-dielectric bonds. In an embodiment, the semiconductor device further includes an encapsulant laterally surrounding the first integrated circuit die, a width of the lid being equal to a width of the first integrated circuit die. In an embodiment, the semiconductor device further includes an encapsulant laterally surrounding the first integrated circuit die, a width of the lid being equal to a width of the cooling cover and greater than a width of the encapsulant. In an embodiment, the semiconductor device further includes a ring structure encircling the encapsulant, the first integrated circuit die and the ring structure being coupled to a substrate, and a width of the substrate being equal to the width of the lid. In an embodiment, the plurality of channels is disposed within a perimeter having a first area in a first plane less than a second area of the first integrated circuit die in a second plane parallel to the first plane. In an embodiment, the first integrated circuit die and a plurality of second integrated circuit dies are laterally surrounded by an encapsulant, outer side surfaces of the lid are aligned with outer side surfaces of the encapsulant, and sidewalls of the channels of the plurality of channels are aligned with side surfaces of the second integrated circuit dies. In an embodiment, the plurality of channels includes a first plurality of channels and a second plurality of channels, each of the first plurality of channels extending in a first direction parallel to one another, each of the second plurality of channels extending in a second direction parallel to one another, the second direction being perpendicular to the first direction.

In accordance with another embodiment, a semiconductor package includes a substrate; an interposer coupled to the substrate; a first integrated circuit die coupled to a side of the interposer opposite the substrate; a lid coupled to a side of the first integrated circuit die opposite the interposer, the lid including a plurality of channels in a surface of the lid opposite the interposer, the lid being coupled to the first integrated circuit die by dielectric-to-dielectric bonds; and a cooling cover coupled to the lid, the cooling cover being in fluid communication with the channels. In an embodiment, the semiconductor package further includes a ring structure, the ring structure being coupled to the cooling cover by a first adhesive in contact with the cooling cover, the ring structure being coupled to the substrate by a second adhesive. In an embodiment, the semiconductor package further includes a ring structure, the ring structure being coupled to the lid by a first adhesive in contact with the lid, the ring structure being coupled to the substrate by a second adhesive. In an embodiment, the semiconductor package further includes an encapsulant laterally surrounding the first integrated circuit die; and four second integrated circuit dies in the encapsulant, a perimeter of the plurality of channels being aligned with two sidewalls of the first integrated circuit die and two sidewalls of each of the second integrated circuit dies. In an embodiment, a perimeter of the plurality of channels is aligned with a perimeter of the first integrated circuit die. In an embodiment, the channels of the plurality of channels are triangular in a cross-sectional view.

In accordance with yet another embodiment, a method includes bonding an integrated circuit die to a substrate; forming an encapsulant over the substrate and laterally surrounding the integrated circuit die; bonding a lid to the integrated circuit die and the encapsulant, the bonding including forming dielectric-to-dielectric bonds, the lid including a plurality of channels opposite the integrated circuit die and the encapsulant; singulating the lid; bonding a cooling cover to the lid; and flowing a liquid coolant from the cooling cover through the plurality of channels. In an embodiment, the method further includes forming the plurality of channels in the lid using a wet etching process. In an embodiment, the method further includes forming the plurality of channels in the lid using a die sawing process. In an embodiment, the method further includes singulating the substrate and the encapsulant simultaneously with the lid. In an embodiment, bonding the lid to the integrated circuit die and the encapsulant further includes depositing an adhesive over the integrated circuit die, the dielectric-to-dielectric bonds being formed between the encapsulant and the lid.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
bonding a first integrated circuit die to a first substrate;
forming an encapsulant over the first substrate and the first integrated circuit die;
directly bonding a lid to the first integrated circuit die, wherein the bonding comprises forming dielectric-to-dielectric bonds between a first side of the lid and a backside of the first integrated circuit die, a second side of the lid comprising channels;
after directly bonding the lid to the first integrated circuit die, singulating the lid; and
after singulating the lid, bonding a cooling cover to the second side of the lid, the cooling cover sealing the channels, wherein an entirety of a surface of the cooling cover facing the lid is planar.

2. The method of claim 1, further comprising:
attaching the first substrate to a second substrate; and
attaching a ring structure to the lid and the second substrate.

3. The method of claim 2, wherein the ring structure is attached to the lid using a first adhesive, wherein the ring structure is attached to the second substrate using a second adhesive.

4. The method of claim 1, wherein a width of the cooling cover is greater than a width of the lid after singulating the lid.

5. The method of claim 1, further comprising:
bonding a second integrated circuit die to the first substrate, wherein the lid and the cooling cover extend over the second integrated circuit die.

6. The method of claim 1, wherein the channels are formed in the lid after bonding the lid to the first integrated circuit die.

7. The method of claim 1, wherein bonding the cooling cover to the second side of the lid comprises bonding the cooling cover to the second side of the lid using an adhesive.

8. A method comprising:
bonding a first integrated circuit die and a second integrated circuit die to a first substrate;

forming an encapsulant over the first substrate, the first integrated circuit die, and the second integrated circuit die;
thinning the encapsulant to expose a back surface of the first integrated circuit die and a back surface of the second integrated circuit die;
bonding a lid to the first integrated circuit die and the second integrated circuit die, wherein the bonding comprises forming dielectric-to-dielectric bonds between a first surface of the lid and the back surface of the first integrated circuit die and between the first surface of the lid and the back surface of the second integrated circuit die;
after bonding the lid to the first integrated circuit die, forming trenches in a second surface of the lid, wherein the trenches extend only partially through the lid;
singulating to form a first package and a second package, the first package comprising the first integrated circuit die, the second package comprising the second integrated circuit die; and
attaching a bottom surface of a cooling cover directly to the second surface of the lid of the first package, the cooling cover extending over the trenches.

9. The method of claim 8, wherein the cooling cover has a width greater than a width of the lid.

10. The method of claim 9, wherein the cooling cover is attached to the lid by a screw-type fastener, wherein the screw-type fastener extends through the cooling cover, and wherein the lid is free from the screw-type fastener.

11. The method of claim 8, wherein the encapsulant is completely covered by the lid.

12. The method of claim 8, wherein an edge of the lid is aligned to an edge of the first substrate.

13. The method of claim 8, further comprising:
attaching the first substrate to a second substrate; and
attaching a ring structure to the second substrate, wherein the ring structure extends along opposing sidewalls of the cooling cover.

14. A method comprising:
bonding a first integrated circuit die to a substrate;
forming an encapsulant on the substrate and laterally surrounding the first integrated circuit die;
bonding a lid to the first integrated circuit die by dielectric-to-dielectric bonds, the lid covering the encapsulant, wherein the lid has a first surface facing the first integrated circuit die and a second surface facing away from the first integrated circuit die, wherein the lid comprises a plurality of channels in the second surface; and
attaching a first surface of a cooling cover to the second surface of the lid, wherein an entirety of the first surface of the cooling cover is a planar surface, wherein the planar surface of the cooling cover extends completely over the plurality of channels, wherein the cooling cover is attached to the lid by a screw-type fastener, wherein the screw-type fastener extends through the cooling cover.

15. The method of claim 14, further comprising:
bonding a second integrated circuit die to the substrate, wherein forming the encapsulant comprises forming the encapsulant laterally surrounding the second integrated circuit die.

16. The method of claim 15, further comprising:
bonding the lid to the second integrated circuit die by dielectric-to-dielectric bonds.

17. The method of claim 14, further comprising:
prior to bonding the lid, performing a first singulation on the substrate to form a first package.

18. The method of claim 17, further comprising:
performing a second singulation on the lid.

19. The method of claim 14, wherein the lid is free of the screw-type fastener.

20. The method of claim 8, wherein attaching the cooling cover is performed after singulating to form the first package and the second package.

* * * * *